United States Patent
Chow et al.

(10) Patent No.: US 7,539,020 B2
(45) Date of Patent: May 26, 2009

(54) LIQUID COOLING LOOPS FOR SERVER APPLICATIONS

(75) Inventors: Norman Chow, Milpitas, CA (US); Paul Tsao, Los Altos, CA (US); Douglas E. Werner, Santa Clara, CA (US); Mark McMaster, Menlo Park, CA (US); Girish Upadhya, Cupertino, CA (US); Frederic Landry, San Francisco, CA (US); Ian Spearing, Westerville, OH (US); Tim Schrader, Irwin, OH (US)

(73) Assignee: Cooligy Inc., Mountain View, CA (US)

( * ) Notice: Subject to any disclaimer, the term of this patent is extended or adjusted under 35 U.S.C. 154(b) by 54 days.

(21) Appl. No.: 11/707,332

(22) Filed: Feb. 16, 2007

(65) Prior Publication Data

US 2007/0201210 A1    Aug. 30, 2007

Related U.S. Application Data

(60) Provisional application No. 60/774,764, filed on Feb. 16, 2006.

(51) Int. Cl.
*H05K 7/16* (2006.01)
(52) U.S. Cl. ............... 361/726; 165/104.21; 312/223.1; 361/759
(58) Field of Classification Search ............... 361/687, 361/699–704, 720–721, 724–727, 756, 759; 165/80.3–80.5, 104.33, 185; 174/15.2; 257/714–715
See application file for complete search history.

(56) References Cited

U.S. PATENT DOCUMENTS 2,039,593 A    5/1936    Hubbuch et al.

(Continued)

FOREIGN PATENT DOCUMENTS

CN    97212126.9    3/1997

(Continued)

OTHER PUBLICATIONS

Stephen C. Jacobsen et al., "Fused Quartz Substrates for Microchip Electrophoresis", Analytical Chemistry, vol. 67, No. 13, Jul. 1, 1995, pp. 2059-2063.

(Continued)

*Primary Examiner*—Jayprakash N Gandhi
*Assistant Examiner*—Courtney Smith
(74) *Attorney, Agent, or Firm*—Haverstock & Owens LLP

(57) ABSTRACT

A mounting system provides mechanisms and form factors for bringing a heat exchanger from a server rack into thermal contact with a heat exchanger from a electronics server. To ensure good thermal contact, pressure is applied between the two heat exchangers, the rejector plate and the chassis cold plate. The mounting mechanism used to engage and disengage the heat exchangers is configured to isolate the force applied to the two heat exchangers. The mounting mechanism includes an interlocking mechanism that prevents transfer of the applied force to the rest of the electronics server. Without isolating this force, the force is applied to the electronics server and/or the rack chassis, possibly disconnecting the electrical connections between the electronics server and the rack, as well as providing mechanical stress to the electronics server and the rack chassis. The mounting mechanism is also coupled to the electronics server locking mechanism such that the action of locking the electronics server into the rack causes the heat exchangers to engage in thermal contact. This is a fail safe procedure since no separate process is required to engage the electronics server cooling loop.

65 Claims, 14 Drawing Sheets

U.S. PATENT DOCUMENTS

| | | | |
|---|---|---|---|
| 3,361,195 A | 1/1968 | Meyerhoff et al. | |
| 3,524,497 A | 8/1970 | Chu et al. | 165/80 |
| 3,771,219 A | 11/1973 | Tuzi et al. | 29/583 |
| 3,817,321 A | 6/1974 | von Cube et al. | 165/105 |
| 3,948,316 A | 4/1976 | Souriau | 165/105 |
| 3,993,123 A | 11/1976 | Chu et al. | 165/80 |
| 4,109,707 A | 8/1978 | Wilson et al. | 165/46 |
| 4,203,488 A | 5/1980 | Johnson et al. | 165/80 |
| 4,235,285 A | 11/1980 | Johnson et al. | 165/80 |
| 4,296,455 A | 10/1981 | Leaycraft et al. | 361/383 |
| 4,312,012 A | 1/1982 | Freiser et al. | 357/82 |
| 4,332,291 A | 6/1982 | Mulock/Bentley | 165/76 |
| 4,345,267 A | 8/1982 | Corman et al. | 357/81 |
| 4,450,472 A | 5/1984 | Tuckerman et al. | 357/82 |
| 4,467,861 A | 8/1984 | Kiseev et al. | 165/104.22 |
| 4,485,429 A | 11/1984 | Mittal | 361/386 |
| 4,516,632 A | 5/1985 | Swift et al. | 165/167 |
| 4,540,115 A | 9/1985 | Hawrylo | 228/123 |
| 4,561,040 A | 12/1985 | Eastman et al. | 361/385 |
| 4,567,505 A | 1/1986 | Pease et al. | 357/81 |
| 4,568,431 A | 2/1986 | Polan et al. | 204/13 |
| 4,573,067 A | 2/1986 | Tuckerman et al. | 357/82 |
| 4,574,876 A | 3/1986 | Aid | 165/46 |
| 4,716,494 A | 12/1987 | Bright et al. | 361/386 |
| 4,758,926 A | 7/1988 | Herrell et al. | 361/385 |
| 4,791,983 A | 12/1988 | Nicol et al. | 165/80.4 |
| 4,793,405 A | 12/1988 | Diggelmann et al. | 165/104.33 |
| 4,866,570 A | 9/1989 | Porter | 361/382 |
| 4,868,712 A | 9/1989 | Woodman | 361/388 |
| 4,884,331 A | 12/1989 | Hinshaw | 29/558 |
| 4,894,709 A | 1/1990 | Phillips et al. | 357/82 |
| 4,896,719 A | 1/1990 | O'Neill et al. | 165/170 |
| 4,903,761 A | 2/1990 | Cima | 165/104.25 |
| 4,908,112 A | 3/1990 | Pace | 204/299 |
| 4,938,280 A | 7/1990 | Clark | 165/80.4 |
| 4,978,638 A | 12/1990 | Buller et al. | 437/209 |
| 4,987,996 A | 1/1991 | Anderson | 206/321 |
| 5,009,760 A | 4/1991 | Zare et al. | 204/183.3 |
| 5,016,090 A | 5/1991 | Galyon et al. | 357/82 |
| 5,016,138 A | 5/1991 | Woodman | 361/381 |
| 5,043,797 A | 8/1991 | Lopes | 357/82 |
| 5,057,908 A | 10/1991 | Weber | 357/81 |
| 5,070,040 A | 12/1991 | Pankove | 437/209 |
| 5,083,194 A | 1/1992 | Bartilson | 357/81 |
| 5,088,005 A | 2/1992 | Ciaccio | 361/385 |
| 5,099,311 A | 3/1992 | Bonde et al. | 357/82 |
| 5,099,910 A | 3/1992 | Walpole et al. | 165/80.4 |
| 5,105,430 A | 4/1992 | Mundinger et al. | 372/35 |
| 5,125,451 A | 6/1992 | Matthews | 165/80.4 |
| 5,131,233 A | 7/1992 | Cray et al. | 62/64 |
| 5,161,089 A | 11/1992 | Chu et al. | 361/385 |
| 5,203,401 A | 4/1993 | Hamburgen et al. | 165/80.4 |
| 5,218,515 A | 6/1993 | Bernhardt | 361/385 |
| 5,228,502 A | 7/1993 | Chu et al. | 165/80.4 |
| 5,232,047 A | 8/1993 | Matthews | 165/168 |
| 5,239,200 A | 8/1993 | Messina et al. | 257/714 |
| 5,239,443 A | 8/1993 | Fahey et al. | 361/689 |
| 5,247,800 A | 9/1993 | Mruzek et al. | 62/51.1 |
| 5,263,251 A | 11/1993 | Matthews | 29/840.036 |
| 5,265,670 A | 11/1993 | Zingher | 165/80.4 |
| 5,269,372 A | 12/1993 | Chu et al. | 165/80.4 |
| 5,274,920 A | 1/1994 | Matthews | 29/890.039 |
| 5,275,237 A | 1/1994 | Rolfson et al. | 265/80.5 |
| 5,285,347 A | 2/1994 | Fox et al. | 361/385 |
| 5,299,635 A | 4/1994 | Abraham | 165/173 |
| 5,307,236 A | 4/1994 | Rio et al. | 361/720 |
| 5,308,429 A | 5/1994 | Bradley | 156/306.6 |
| 5,309,319 A | 5/1994 | Messina | 361/699 |
| 5,310,440 A | 5/1994 | Zingher | 156/345 |
| 5,316,077 A | 5/1994 | Reichard | 165/104.28 |
| 5,317,805 A | 6/1994 | Hoopman et al. | 29/890.03 |
| 5,325,265 A | 6/1994 | Turlik et al. | 361/702 |
| 5,346,000 A | 9/1994 | Schlitt | 165/104.26 |
| 5,380,956 A | 1/1995 | Loo et al. | 174/252 |
| 5,383,340 A | 1/1995 | Larson et al. | 62/259 |
| 5,388,635 A | 2/1995 | Gruber et al. | 165/80.4 |
| 5,397,919 A | 3/1995 | Tata et al. | 257/717 |
| 5,421,943 A | 6/1995 | Tam et al. | 156/273.9 |
| 5,424,918 A | 6/1995 | Felps et al. | 361/704 |
| 5,427,174 A | 6/1995 | Lomolino, Sr. et al. | 165/1 |
| 5,436,793 A | 7/1995 | Sanwo et al. | 361/689 |
| 5,459,099 A | 10/1995 | Hsu | 437/180 |
| 5,490,117 A | 2/1996 | Oda et al. | 365/226 |
| 5,508,234 A | 4/1996 | Dusablon, Sr. et al. | 437/228 |
| 5,514,832 A | 5/1996 | Dusablon, Sr. et al. | 174/15.1 |
| 5,514,906 A | 5/1996 | Love et al. | 257/712 |
| 5,520,244 A | 5/1996 | Mundinger et al. | 165/104.33 |
| 5,544,696 A | 8/1996 | Leland | 165/80.4 |
| 5,548,605 A | 8/1996 | Benett et al. | 372/36 |
| 5,575,929 A | 11/1996 | Yu et al. | 216/10 |
| 5,585,069 A | 12/1996 | Zanzucchi et al. | 422/100 |
| 5,641,400 A | 6/1997 | Kaltenbach et al. | 210/198.2 |
| 5,675,473 A | 10/1997 | McDunn et al. | 361/699 |
| 5,692,558 A | 12/1997 | Hamilton et al. | 165/80.4 |
| 5,696,405 A | 12/1997 | Weld | 257/714 |
| 5,726,495 A | 3/1998 | Aihara et al. | 257/722 |
| 5,727,618 A | 3/1998 | Mundinger et al. | 165/80.4 |
| 5,740,013 A | 4/1998 | Roesner et al. | 361/697 |
| 5,761,037 A | 6/1998 | Anderson et al. | 361/700 |
| 5,763,951 A | 6/1998 | Hamilton et al. | 257/714 |
| 5,768,104 A | 6/1998 | Salmonson et al. | 361/704 |
| 5,774,779 A | 6/1998 | Tuchinskiy | 419/2 |
| 5,800,690 A | 9/1998 | Chow et al. | 204/451 |
| 5,801,442 A | 9/1998 | Hamilton et al. | 257/714 |
| 5,811,062 A | 9/1998 | Wegeng et al. | 422/129 |
| 5,829,514 A | 11/1998 | Smith et al. | 165/78 |
| 5,830,826 A | 11/1998 | Fischer et al. | 504/195 |
| 5,835,345 A | 11/1998 | Staskus et al. | 361/699 |
| 5,858,188 A | 1/1999 | Soane et al. | 204/454 |
| 5,863,708 A | 1/1999 | Zanzucchi et al. | 430/320 |
| 5,870,823 A | 2/1999 | Bezama et al. | 29/848 |
| 5,874,795 A | 2/1999 | Sakamoto | 310/156 |
| 5,880,524 A | 3/1999 | Xie | 257/404 |
| 5,886,870 A | 3/1999 | Omori | 361/704 |
| 5,901,037 A | 5/1999 | Hamilton et al. | 361/699 |
| 5,921,087 A | 7/1999 | Bhatia et al. | 62/3.2 |
| 5,927,390 A | 7/1999 | Lehman | 165/122 |
| 5,936,192 A | 8/1999 | Tauchi | 136/203 |
| 5,945,217 A | 8/1999 | Hanrahan | 428/389 |
| 5,946,191 A * | 8/1999 | Oyamada | 361/700 |
| 5,964,092 A | 10/1999 | Tozuka et al. | 62/3.7 |
| 5,965,001 A | 10/1999 | Chow et al. | 204/600 |
| 5,978,220 A | 11/1999 | Frey et al. | 361/699 |
| 5,983,997 A | 11/1999 | Hou | 165/144 |
| 5,993,750 A | 11/1999 | Ghosh et al. | 422/191 |
| 5,997,713 A | 12/1999 | Beetz et al. | 205/124 |
| 5,998,240 A | 12/1999 | Hamilton et al. | 438/122 |
| 6,007,309 A | 12/1999 | Hartley | 417/322 |
| 6,014,312 A | 1/2000 | Schulz-Harder et al. | 361/699 |
| 6,019,165 A | 2/2000 | Batchelder | 165/80.3 |
| 6,084,178 A | 7/2000 | Cromwell | 174/35 |
| 6,086,330 A | 7/2000 | Press et al. | 416/223 |
| 6,101,715 A | 8/2000 | Fuesser et al. | 29/890.03 |
| 6,166,907 A | 12/2000 | Chien | 361/699 |
| 6,272,012 B1 | 8/2001 | Medin et al. | 361/690 |
| 6,324,075 B1 | 11/2001 | Unrein et al. | 361/816 |
| 6,351,384 B1 | 2/2002 | Daikoku et al. | 361/704 |
| 6,366,462 B1 | 4/2002 | Chu et al. | 361/699 |
| 6,367,544 B1 | 4/2002 | Calaman | 165/135 |
| 6,381,846 B2 | 5/2002 | Insley et al. | 29/890.039 |
| 6,385,044 B1 | 5/2002 | Colbert et al. | 361/700 |
| 6,397,932 B1 | 6/2002 | Calaman et al. | 165/80.4 |
| 6,407,916 B1 | 6/2002 | Konstad | 361/687 |
| 6,449,162 B1 | 9/2002 | Corbin, Jr. et al. | 361/719 |

| | | | |
|---|---|---|---|
| 6,457,515 B1 | 10/2002 | Vafai et al. | 165/80.4 |
| 6,469,893 B1 | 10/2002 | Frutschy et al. | 361/700 |
| 6,536,510 B2 | 3/2003 | Khrustalev et al. | 165/104.33 |
| 6,578,626 B1 | 6/2003 | Calaman et al. | 165/80.4 |
| 6,643,132 B2* | 11/2003 | Faneuf et al. | 361/700 |
| 6,657,121 B2 | 12/2003 | Garner | 174/16.3 |
| 6,674,642 B1 | 1/2004 | Chu et al. | 361/687 |
| 6,674,643 B2* | 1/2004 | Centola et al. | 361/720 |
| 6,675,875 B1 | 1/2004 | Vafai et al. | 165/80.4 |
| 6,693,797 B2* | 2/2004 | Faneuf et al. | 361/689 |
| 6,700,785 B2* | 3/2004 | Berry et al. | 361/726 |
| 6,729,383 B1 | 5/2004 | Cannell et al. | 165/80.3 |
| 6,757,169 B2 | 6/2004 | Kondo et al. | 361/699 |
| 6,763,880 B1 | 7/2004 | Shih | 165/80.4 |
| 6,776,221 B2* | 8/2004 | Montgomery et al. | 165/46 |
| 6,795,312 B2 | 9/2004 | Narakino et al. | 361/625 |
| 6,796,372 B2* | 9/2004 | Bear | 165/104.21 |
| 6,807,056 B2 | 10/2004 | Kondo et al. | 361/689 |
| 6,826,922 B2 | 12/2004 | Patel et al. | 62/185 |
| 6,829,142 B2* | 12/2004 | Belady et al. | 361/687 |
| 6,836,407 B2* | 12/2004 | Faneuf et al. | 361/687 |
| 6,865,081 B2 | 3/2005 | Meyer et al. | 361/699 |
| 6,903,929 B2 | 6/2005 | Prasher et al. | 361/699 |
| 6,934,154 B2 | 8/2005 | Prasher et al. | 361/699 |
| 6,942,018 B2 | 9/2005 | Goodson et al. | 165/80.4 |
| 6,955,212 B1 | 10/2005 | Hsieh | 165/80.4 |
| 6,967,842 B2 | 11/2005 | Aoki et al. | 361/701 |
| 6,986,382 B2 | 1/2006 | Upadhya et al. | 165/80.4 |
| 6,992,891 B2 | 1/2006 | Mallik et al. | 361/704 |
| 7,000,684 B2 | 2/2006 | Kenny et al. | 165/80.4 |
| 7,009,843 B2 | 3/2006 | Lee et al. | 361/704 |
| 7,012,807 B2* | 3/2006 | Chu et al. | 361/699 |
| 7,120,021 B2 | 10/2006 | Hamman | 361/699 |
| 7,133,283 B2* | 11/2006 | Faneuf et al. | 361/689 |
| 7,154,749 B2 | 12/2006 | Stefanoski et al. | 361/695 |
| 7,184,269 B2 | 2/2007 | Campbell et al. | 361/700 |
| 7,212,409 B1* | 5/2007 | Belady et al. | 361/721 |
| 7,233,491 B2* | 6/2007 | Faneuf et al. | 361/689 |
| 7,243,704 B2 | 7/2007 | Tustaniwskyi et al. | 165/80 |
| 7,254,957 B2 | 8/2007 | Weber et al. | 62/259.2 |
| 7,280,363 B2 | 10/2007 | Reyzin et al. | 361/719 |
| 7,301,773 B2 | 11/2007 | Brewer et al. | 361/719 |
| 7,334,630 B2 | 2/2008 | Goodson et al. | 165/104.33 |
| 2002/0031948 A1 | 3/2002 | Yasufuku et al. | 439/625 |
| 2002/0051341 A1 | 5/2002 | Frutschy et al. | 361/700 |
| 2003/0097846 A1 | 5/2003 | Novotny et al. | 62/3.7 |
| 2003/0123228 A1 | 7/2003 | Bhatia et al. | 361/705 |
| 2004/0008483 A1 | 1/2004 | Cheon | 361/687 |
| 2004/0050231 A1 | 3/2004 | Chu et al. | 83/574 |
| 2004/0052049 A1 | 3/2004 | Wu et al. | 361/699 |
| 2004/0057211 A1 | 3/2004 | Kondo et al. | 361/696 |
| 2004/0099410 A1 | 5/2004 | Ghosh | 165/185 |
| 2004/0112585 A1 | 6/2004 | Goodson et al. | 165/299 |
| 2004/0126863 A1 | 7/2004 | Fidock et al. | 435/196 |
| 2004/0188076 A1 | 9/2004 | Lee | 165/174 |
| 2004/0206477 A1 | 10/2004 | Kenny et al. | 165/80.4 |
| 2004/0221604 A1 | 11/2004 | Ota et al. | 62/259.2 |
| 2005/0082666 A1 | 4/2005 | Lee et al. | 257/728 |
| 2005/0083657 A1 | 4/2005 | Hamman | 361/699 |
| 2005/0117298 A1 | 6/2005 | Koga et al. | 361/699 |
| 2005/0133200 A1 | 6/2005 | Malone et al. | 165/80.4 |
| 2005/0247433 A1 | 11/2005 | Corrado et al. | 165/80.4 |
| 2005/0257532 A1 | 11/2005 | Ikeda et al. | 62/3.7 |
| 2005/0259393 A1 | 11/2005 | Vinson et al. | 361/690 |
| 2005/0270742 A1 | 12/2005 | Brewer et al. | 361/696 |
| 2006/0023422 A1 | 2/2006 | Shum et al. | 361/695 |
| 2006/0037739 A1 | 2/2006 | Utsunomiya | 165/104.33 |
| 2006/0056156 A1 | 3/2006 | Long et al. | 361/704 |
| 2006/0067052 A1 | 3/2006 | Llapitan et al. | 361/700 |
| 2006/0102999 A1 | 5/2006 | Tustaniwskyi et al. | 257/688 |
| 2006/0133039 A1 | 6/2006 | Belady | 361/699 |
| 2006/0137863 A1 | 6/2006 | Lee et al. | 165/104.33 |
| 2006/0139882 A1 | 6/2006 | Mikubo et al. | 361/699 |
| 2006/0187639 A1* | 8/2006 | Carswell | 361/699 |
| 2007/0042514 A1 | 2/2007 | Wu et al. | 438/17 |
| 2007/0115634 A1 | 5/2007 | Laing | 361/699 |
| 2008/0013283 A1* | 1/2008 | Gilbert et al. | 361/715 |

FOREIGN PATENT DOCUMENTS

| | | |
|---|---|---|
| DE | 42 42 841 A1 | 11/1997 |
| EP | 1 520 993 A2 | 6/2005 |
| JP | 64-024447 | 1/1989 |
| JP | 6-326226 | 11/1994 |
| JP | 9-102568 | 4/1997 |
| JP | 10223811 | 8/1998 |
| JP | 2000-277540 | 10/2000 |
| JP | 306614 | 3/2005 |
| TW | 402680 | 9/2000 |
| TW | 449040 | 8/2001 |
| TW | 0502102 B | 9/2002 |
| TW | 0306614 Y | 2/2007 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Micromech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical Systems, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, pp. 267-272.

G. Mohiuddin Mala et al., "Heat transfer and fluid flow in microchannels", 1997, Int. J. Heat Mass transfer, vol. 40, No. 13, pp. 3079-3088, printed in Great Britain.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000), pp. 787-790.

J. C. Y. Koh et al., "Heat Transfer of Microstructures for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", Dec. 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Abearn et al., "Silicon Heat Sink Method to Control Integrated Circuit Chip Operating Temperatures", IBM Technical Disclosure Bulletin, vol. 21, No. 8, Jan. 1979, pp. 3378-3380.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobem, "Thermoelectrically Cooled Module", IBM Technical Disclosure Bulletin, vol. 27, No. 1A, Jun. 1984, p. 30.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin, vol. 39, No. 04, Apr. 1996, pp. 115-116.

C. J. Keller et al., "Jet Cooling Cup for Cooling Semiconductor Devices", IBM Technical Disclosure Bulletin, vol. 20, No. 9, Feb. 1978, p. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold et al., "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12, May 1989, p. 34.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.

"Water-Cooled Circuit Module with Grooves Forming Water Passages Near Heat-Producing Devices", IBM Technical Disclosure, vol. 31, No. 12, May 1989, pp. 49-50.

"Cold Plate for Thermal Conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, pp. 129-130.

"Means of Removing More Heat From a TCM (Or Other Liquid-Cooled Logic Package) By Reducing the Coolant Temperature", IBM Technical Disclosure Bulletin, vol. 32, No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosure Bulletin, vol. 27, No. 10A, Mar. 1985, p. 5656-5657.

Thermal Conduction Module with Liquid Dielectric and Pistons with Surface Treatment.

Youngcheol Joo et al., "Fabrication of Monolithic Microchannels for IC Chip Cooling", 1995, IEEE Micro Electro Mechanical Systems, pp. 362-367.

Andreas Manz et al., "Electroosmotic pumping and electrophoretic separations for miniaturized chemical analysis systems", Sep. 16, 1994, J.Micromech. Microeng. 4 (1994), pp. 257-265, printed in the U.K.

E. B. Cummings et al., "Irrotationality of uniform electroosmosis", Sep. 1999, Part of the SPIE Conference on Microfluidic Devices and Systems II, SPIE vol. 3877, pp. 180-189.

Haim H. Bau, "Optimization of conduits' shape in micro heat exchangers", Dec. 10, 1997, International Journal of Heat and Mass Transfer 41 (1998), pp. 2717-2723.

V. K. Dwivedi et al., "Fabrication of very smooth walls and bottoms of silicon microchannels for heat dissipation of semiconductor devices", Jan. 25, 2000, Microelectronics Journal 31 (2000), pp. 405-410.

M. B. Bowers et al.,, "Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.

Meint J. de Boer et al., "Micromachining of Buried Micro Channels in Silicon", Mar. 2000, Journal of Microelectromechanical systems, vol. 9, No. 1, pp. 94-103.

S. B. Choi et al., "Fluid Flow and Heat Transfer in Microtubes", 1991, DSC-vol. 32, Micromechanical sensors, Actuators, and Systems, ASME 1991, pp. 123-134.

S. F. Choqueet, M. Faghri et al., "Optimum Design of Microchannel Heat Sinks", DSC-vol. 59, Microelectromechanical Systems (MEMS), ASME 1996, pp. 115-126.

David Copeland et al., "Manifold Microchannel Heat Sinks: Theory and Experiment", EEP-vol. 10-2, Advances in Electronic Packaging ASME, 1995, pp. 829-835.

J. M. Cuta et al., "Forced Convection Heat Transfer in Parallel Channel Array Microchannel Heat Exchanger", PID-vol. 2 / HTD-vol. 338, Advances in Energy efficiency, Heat/Mass Transfer Enhancement, ASME 1996, pp. 17-23.

K. Fushinobu et al., "Heat Generation and Transport in Sub-Micron Semiconductor Devices", HTD-vol. 253, Heat Transfer on the Microscale, ASME 1993, pp. 21-28.

Charlotte Gillot et al., "Integrated Micro Heat Sink for Power Multichip Module", IEEE Transactions on Industry Applications, vol. 36, No. 1, Jan./Feb. 2000, pp. 217-221.

John Goodling, "Microchannel heat exchangers—a review", SPIE vol. 1997 High Heat Flux Engineering II (1993), pp. 66-82.

Koichiro Kawano et al., "Micro Channel Heat Exhanger for Cooling Electrical Equipment", HTD-vol. 361-3/PID-vol. 3, Proceedings of the ASME Heat Transfer Division—vol. 3, ASME 1998, pp. 173-188.

Chad Harris et al., "Design and Fabrication of a Cross Flow Micro Heat Exchanger", Dec. 2000, Journal of Microelectromechanical Systems, vol. 9, No. 4, pp. 502-508.

George M. Harpole et al., "Micro-Channel Heat Exchanger Optimization", 1991, Seventh IEEE Semi-Therm Symposium, pp. 59-63.

Pei-Xue Jiang et al., "Thermal-hydraulic performance of small scale micro-channel and porous-media heat-exchangers", International Journal of Heat and Mass Transfer 44 (2001), pp. 1039-1051.

X.N. Jiang et al., "Laminar Flow Through Microchannels Used for Microscale Cooling Systems", 1997, IEEE/CPMT Electronic Packaging Technology Conference, pp. 119-122.

David Bazeley Tuckerman, "Heat-Transfer Microstructures for Integrated Circuits", Feb. 1984, pp. ii-xix, pp. 1-141.

M Esashi, "Silicon micromachining for integrated microsystems", Vacuum/vol. 47/Nos. 6-8/1996, pp. 469-474.

T.S. Ravigururajan et al., "Effects of Heat Flux on Two-Phase Flow Characteristics of Refrigerant Flows in a Micro-Channel Heat Exchanger", HTD-vol. 329, National Heat Transfer Conference, vol. 7, ASME 1996, pp. 167-178.

T.S. Ravigururajan et al., "Single-Phase Flow Thermal Performance Characteristics of a Parallel Micro-Channel Heat Exchanger", HTD-vol. 329, National Heat Transfer Conference, vol. 7, ASME 1996, pp. 157-166.

T.S. Ravigururajan et al., "Liquid Flow Characteristics in a Diamond-Pattern Micro-Heat-Exchanger", DSC-vol. 59 Microelectromechanical Systems (MEMS), ASME 1996, pp. 159-166.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491.

J. Pfahler et al., "Liquid Transport in Micron and Submicron Channels", Mar. 1990, Sensors and Actuators, A21-A23 (1990), pp. 431-434.

Kenneth Pettigrew et al., "Performance of a MEMS based Micro Capillary Pumped Loop for Chip-Level Temperature Control", 2001, The 14th IEEE International Conference on Micro Electro Mechanical Systems, pp. 427-430.

X.F. Peng et al., "Convective heat transfer and flow friction for water flow in microchannel structures", 1996, Int. J. Heat Mass Transfer, vol. 39, No. 12, pp. 2599-2608, printed in Great Britain.

X.F. Peng et al., "Experimental investigation of heat transfer in flat plates with rectangular microchannels", 1994, Int. J. Heat Mass Transfer, vol. 38, No. 1, pp. 127-137, printed in Great Britain.

X.F. Peng et al., "Cooling Characteristics with Microchanneled Structures", 1994, Enhanced Heat Transfer, vol. 1, No. 4, pp. 315-326, printed in the United States of America.

X.F. Peng et al., "Enhancing the Critical Heat Flux Using Microchanneled Surfaces",1998, Enhanced Heat Transfer, vol. 5, pp. 165-176, Printed in India.

Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.

L.J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M.J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.

C.R. Friedrich et al., "Micro heat exchangers fabricated by diamond machining", Jan. 1994, Precision Engineering, vol. 16, No. 1, pp. 56-59.

Mali Mahalingam, "Thermal Management in Semiconductor Device Packaging", Proceedings of the IEEE, vol. 73, No. 9, Sep. 1985, pp. 1396-1404.

T.M. Adams et al., "An experimental investigation of single-phase forced convection in microchannels", 1997, Int. J. Heat Mass Transfer, vol. 41, Nos. 6-7, pp. 851-857, Printed in Great Britain.

Bassam Badran et al., "Experimental Results for Low-Temperature Silicon Micromachined Micro Heat Pipe Arrays Using Water and Methanol as Working Fluids", May 31, 1997, Experimental Heat Transfer, 10: pp. 253-272.

D. Jed Harrison et al., "Electroosmotic Pumping Within A Chemical Sensor System Integrated on Silicon", Session C9 Chemical Sensors and Systems for Liquids, Jun. 26, 1991, pp. 792-795.

Kurt Seiler et al., "Electroosmotic Pumping and Valveless Control of Fluid Flow within a Manifold of Capillaries on a Glass Chip", 1994, Analytical Chemistry, vol. 66, No. 20, Oct. 15, 1994, pp. 3485-3491.

Philip H. Paul et al., "Electrokinetic Generation of High Pressures Using Porous Microstructures", 1998, Micro-Total Analysis Systems, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W.E. Morf et al., "Partial electroosmotic pumping in complex capillary systems Part 1: Principles and general theoretical approach", Oct. 16, 2000, Sensors and Actuators B 72 (2001), pp. 266-272.

M. Esashi, "Silicon micromachining and micromachines", Wear, vol. 168, No. 1-2, (1993), pp. 181-187.

Stephanus Buttgenbach et al., "Microflow devices for miniaturized chemical analysis systems", Nov. 1998, SPIE-Chemical Microsensors and Applications, vol. 3539, pp. 51-61.

Sarah Arulanandam et al., "Liquid transport in rectangular microchannels by electrosmotic pumping", Colloids and Surfaces A: Physicochemical and Engineering Aspects, vol. 161 (2000), pp. 89-102.

Linan Jiang et al., "Closed-Loop Electroosmotic Microchannel Cooling System for VLSI Circuits", Mechanical Engineering Dept. Stanford University, pp. 1-27.

Susan L. R. Barker et al., "Fabrication, Derivatization and Applications of Plastic Microfluidic Devices", Proceedings of SPIE, vol. 4205, 2001, pp. 112-118.

Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.

Chris Bourne, "Cool Chips plc Receives Nanotech Manufacturing Patent", Jul. 31, 2002, pp. 1-2.

Frank Wagner et al., "Electroosmotic Flow Control in Micro Channels Produced by Scanning Excimer Laser Ablation", Proceedings of SPIE vol. 4088, 2000, pp. 337-340.

H. A. Goodman, "Data Processor Cooling With Connection To Maintain Flow Through Standby Pump", Dec. 1983, IBM Technical Disclosure Bulletin, vol. 26, No. 7A, p. 3325.

"Electroerosion Micropump", May 1990, IBM Technical Disclosure Bulletin, vol. 32, No. 12, pp. 342-343.

Shulin Zeng et al., "Fabrication and Characterization of Electrokinetic Micro Pumps", 2000 Inter Society Conference on Thermal Phenomena, pp. 31-35.

A. Manz et al., "Integrated Electroosmotic Pumps and Flow Manifolds for Total Chemical Analysis Systems", 1991, Inter. Conf. on Solid-State Sensors and Actuators, pp. 939-941.

O. T. Guenat et al., "Partial electroosmotic pumping in complex capillary systems Part: 2 Fabrication and application of a micro total analysis system suited for continuous volumetric nanotitrations", Sensors and Actuators B 72 (2001) pp. 273-282.

J. G. Sunderland, "Electrokinetic dewatering and thickening. I. Introduction and historical review of electrokinetic applications", Feb. 1987, Journal of Applied Electrochemistry, vol. 17, No. 5, pp. 889-898.

J. C. Rife et al., "Acousto- and electroosmotic microfluidic controllers", Sep. 1998, Microfluidic Devices and Systems, vol. 3515, pp. 125-135.

Pumendu K Dasgupta et al., "Electroosmosis: A Reliable Fluid Propulsion System for Flow Injection Analysis", Jun. 1994, Anal. Chem., vol. 66, No. 11, pp. 1792-1798.

Ray Beach et al., "Modular Microchannel Cooled Heatsinks for High Average Power Laser Diode Arrays", Apr. 1992, IEEE Journal of Quantum Electronics, vol. 28, No. 4, pp. 966-976.

Roy W. Knight et al., "Optimal Thermal Design of Air cooled Forced Convection Finned Heat Sinks—Experimental Verification", Oct. 1992, IEEE Transactions on Componenets, Hybrids, and Manufacturing Technology, vol. 15, No. 5, pp. 754-760.

Y. Zhuang et al., "Experimental study on local heat transfer with liquid impingement flow in two-dimensional micro-channels", 1997, Int. J. Heat Mass Transfer, vol. 40, No. 17, pp. 4055-4059.

D. Yu et al., "An Experimental and Theoretical Investigation of Fluid Flow and Heat Transfer in Microtubes", 1995, ASME / JSME Thermal Engineering Conference, vol. 1, pp. 523-530.

Xiaoqing Yin et al., "Micro Heat Exchangers", Journal of Electronic Packaging, Mar. 1997, vol. 119, pp. 51-57.

X. Yin et al., "Uniform Channel Micro Heat Exchangers", Journal of Electronic Packaging, Jun. 1997, vol. 119, pp. 89-94.

Chun Yang et al., "Modeling forced liquid convection in rectangular microchannels with electrokinetic effects", International Journal of Heat and Mass Transfer 41 (1998), pp. 4229-4249.

Arel Weisberg et al., "Analysis of microchannels for integrated cooling", 1992, Int. J. Heat Mass Transfer, vol. 35, No. 10, pp. 2465-2473.

Roger S. Stanley et al., "Two-Phase Flow in Microchannels", 1997, DSC-vol. 62/HTD-vol. 354, MEMS, pp. 143-152.

Kambiz Vafai et al., "Analysis of two-layered micro-channel heat sink concept in electronic cooling", Int. J. Heat Mass Transfer, 42 (1999), pp. 2287-2297.

Gokturk Tunc et al., "Heat transfer in rectangular microchannels", Int. J. Heat Mass Transfer, 45 (2002), pp. 765-773.

D. B. Tuckerman et al., "High-Performance Heat Sinking for VLSI", May 1981, IEEE Electron Device Letters, vol. EDL-2, No. 5, pp. 126-129.

Bengt Sunden et al., "An Overview of Fabrication Methods and Fluid Flow and Heat Transfer Characteristics of Micro Channels", pp. 3-23.

S. Sasaki et al., "Optimal Structure of Microgrooved Cooling Fin for High-Power LSI Devices", Electronic Letters, Dec. 4, 1986, vol. 22, No. 25.

Vijay K. Samalam, "Convective Heat Transfer in Microchannels", 1989, Journal of Electronic Materials, vol. 18, No. 5, pp. 611-617.

Sanjay K. Roy et al., "A Very High Heat Flux Microchannel Heat Exchanger for Cooling of Semiconductor Laser Diode Arrays", May 1996, IEEE Transactions on components, packaging, and manufacturing technology-part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM, vol. 20, No. 10, Mar. 1978, pp. 3898-3899.

H. Krumm, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

Plattenwarmeubertrager, Die Bibliothek der Technik 105, published by "moderne industrie", 3$^{rd}$ edition, 2000, ISBN 3-478-93119-3, pp. 34-36.

* cited by examiner

LIQUID COOLING LOOPS FOR SERVER APPLICATIONS

RELATED APPLICATIONS

This application claims priority of U.S. provisional application, Ser. No. 60/774,764, filed Feb. 16, 2006, and entitled "Thermal Interconnect", by these same inventors. This application incorporates U.S. provisional application, Ser. No. 60/774,764 in its entirety by reference.

FIELD OF THE INVENTION

The invention relates to a mounting mechanism in general, and specifically, to a mounting mechanism to form a thermal interface between two heat exchanging devices.

BACKGROUND OF THE INVENTION

Cooling of high performance integrated circuits with high heat dissipation is presenting significant challenge in the electronics cooling arena. Conventional cooling with heat pipes and fan mounted heat sinks are not adequate for cooling chips with every increasing wattage requirements, including those exceeding 100 W.

Electronics servers, such as blade servers and rack servers, are being used in increasing numbers due to the higher processor performance per unit volume one can achieve. However, the high density of integrated circuits also leads to high thermal density, which is beyond the capability of conventional air-cooling methods.

A particular problem with cooling integrated circuits on electronics servers is that multiple electronics servers are typically mounted in close quarters within a server chassis. In such configurations, electronics servers are separated by a limited amount of space, thereby reducing the dimensions within which to provide an adequate cooling solution. Typically, stacking of electronics servers does not provide the mounting of large fans and heat sinks for each electronics server. Often electronics server stacks within a single server chassis are cooled by one large fan, a heat sink or both. Using this configuration, the integrated circuits on each electronics server are cooled using the heat sink and the large fan that blows air over the heat sink, or simply by blowing air directly over the electronics servers. However, considering the limited free space surrounding the stacked electronics servers within the server chassis, the amount of air available for cooling the integrated circuits is limited.

As servers increase in power and power density, it is no longer feasible to air cool the entire server rack. Liquid cooling systems, such as closed-loop liquid cooling systems and heat pipes, present alternative methodologies for conventional cooling solutions. Liquid cooling needs to occur at the integrated circuit level on a electronics server. Due to the density of the electronics and the high power densities of ultra high performance servers, the heat picked up by a liquid cooling loop cannot be effectively discharged to the air via a radiator, as is common practice in other form factors such as desktops and work stations. The heat must be transferred to the server rack cooling system, which may be comprised of a pumped refrigerant or chilled water loop. A key requirement of servers is the ability to swap in and out electronics servers. As such, there is a need to effectively connect and disconnect each electronics server and its corresponding cooling system to and from the rack cooling system.

SUMMARY OF THE INVENTION

Cooling systems of the present invention are directed to cooling solutions used to transfer heat produced by one or more heat generating devices, such as microprocessors or other integrated circuits, from one or more electronics servers to the ambient. In some embodiments, a liquid-based cooling system is used. A server chassis is configured to house multiple electronics servers. Examples of electronics servers includes, but are not limited to, blade servers and rack servers. Each electronics server is coupled to a backplane or mid-plane within the server chassis. For purposes of this disclosure, the terms "backplane" and "mid-plane" are used interchangeably. Each electronics server includes one or more heat generating devices. Integrated onto each electronics server is a liquid based cooling system. Each liquid based cooling system includes a server pump and one or more microchannel cold plates (MCP). Fluid lines preferably couple the MCPs and the server pump. In other embodiments, heat pipes or conduction means are used instead of the liquid-based cooling system.

The liquid based cooling system for each electronics server includes a rejector plate. Each rejector plate is configured with fluid channels, preferably micro-channels. Alternatively, each rejector plate is configured with macro-channels. The micro-channels are coupled to the fluid lines thereby forming a first closed loop including the MCPs, the server pump and the rejector plate. The rejector plate is coupled to a chassis cold plate via a thermal interface material, thereby forming a thermal interface. The thermal interface is configured along a plane that is non-perpendicular to an insertion vector of the electronics server into a server rack chassis. In some embodiments, the thermal interface plane is parallel to the insertion vector. The rejector plates for each of the electronics servers are coupled to the chassis cold plate in this manner. The chassis cold plate is coupled to the server chassis. The chassis cold plate includes one or more heat exchanging elements.

The chassis cold plate includes fluid channels which are coupled via fluid lines to a liquid-to-air heat exchanging system. The liquid-to-air heat exchanging system includes a heat rejector, one or more fans, and an external pump. The chassis cold plate, the heat rejector, the external pump, and fluid lines connected thereto form a second closed loop.

Fluid is pumped through the first closed loop such that heat generated by each heat generating device on the electronics server is transferred to the fluid flowing through each respective MCP coupled to the heat generating devices. The heated fluid flows into the fluid channels within the rejector plate. Within the second closed loop system, fluid is pumped through the fluid channels in the chassis cold plate by the external pump. Heat within the fluid flowing through each rejector plate is transferred through a thermal interface to the chassis cold plate and to the fluid flowing through the chassis cold plate. Heated fluid within the chassis cold plate is pumped to the heat rejector within the liquid-to-air heat exchanging system, where heat is transferred from the fluid to the air. Fluid flowing in the first closed loop system is independent of fluid flowing in the second closed loop system.

Fundamental to the operation of the independent cooling loops system described above is the thermal interface formed between the rejector plate of the electronics server and the chassis cold plate of the server rack. These cooling systems provide mechanisms and form factors for bringing a heat exchanger from the rack into thermal contact with a heat exchanger from the electronics server. For low thermal resistance, a thermal interface material (TIM), such as thermal grease or a thermal pad, may be used. To ensure good thermal contact, pressure is applied between the two heat exchangers, the rejector plate and the chassis cold plate. Methods for applying pressure include, but are not limited to, mechanical clamping, springs, electro-mechanical motors or actuators, pneumatics and hydraulics. The heat exchangers can take a variety of shapes, including planar, cylindrical, curvilinear, or other non-planar configurations. The mating surfaces of the heat exchangers can be smooth or with physical features such as mating teeth to increase surface area or ensure alignment. Thermal contact can be made on one or more surfaces creating a sandwich type structure. A heat exchanger can be a single solid piece or can be made up of an array of smaller heat exchangers to allow flexibility when mating curved to curved surfaces.

The mounting mechanism used to engage and disengage the heat exchangers is configured to isolate the force applied to the two heat exchangers. The mounting mechanism includes an interlocking channel mechanism that prevents transfer of the applied force to the rest of the electronics server or rack chassis. Without isolating this force, the force applied to the electronics server may result in disconnecting the electrical connections between the electronics server and the rack, as well as providing mechanical stress to the electronics server and the rack chassis. The mounting mechanism can be coupled to the electronics server locking mechanism such that the action of locking the electronics server into the server rack causes the heat exchangers to engage in thermal contact. This is a fail safe procedure since no separate process is required to engage the electronics server cooling loop. Similarly, unlocking the electronics server causes the heat exchangers to disengage allowing the electronics to be removed without interference from either the electronics server cooling loop or the rack cooling loop.

Other features and advantages of the present invention will become apparent after reviewing the detailed description of the embodiments set forth below.

BRIEF DESCRIPTION OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
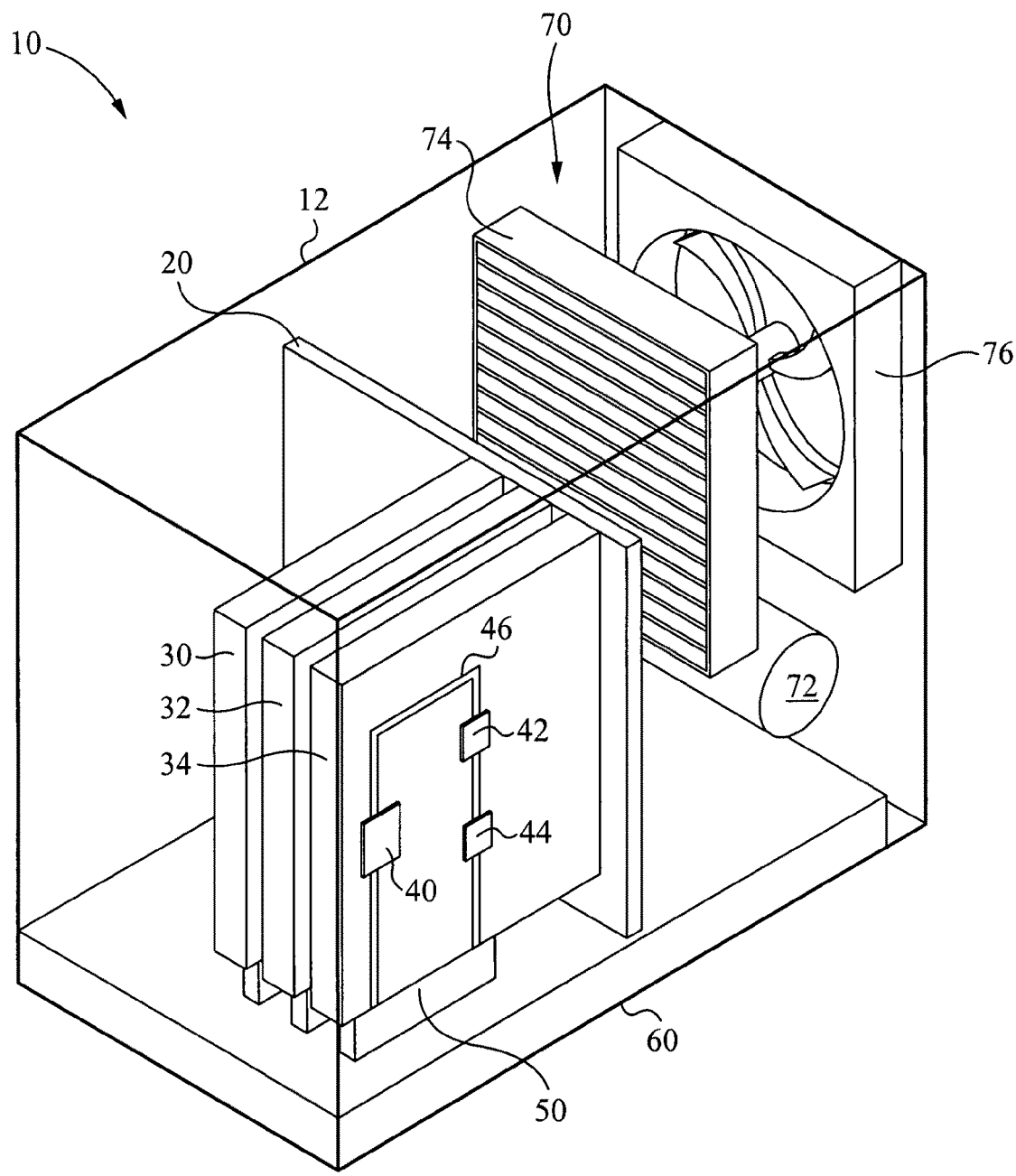
FIG. 1 illustrates a perspective view of an exemplary cooling system according to the first embodiment of the present invention.

Embodiments of the present invention are directed to a cooling system that transfers heat generated by one or more heat generating devices on a electronics server to a liquid-to-air heat exchanging system. The cooling system described herein can be applied to any electronics sub-system that is mounted to a backplane, including but not limited to, a blade server and a rack server. A server chassis is configured to house multiple electronics servers. Each electronics server is coupled to a backplane or mid-plane within the server chassis. Each electronics server includes one or more processors as is well known in the art. Integrated onto each electronics server is a cooling system. In some embodiments, the cooling system is a liquid-based cooling system. Each liquid-based cooling system includes a server pump and one or more micro-channel cold plates (MCP). Preferably, each liquid-based cooling system is configured with one MCP for each heat generating device on the electronics server. The MCPs and the server pump are preferably mounted to the electronics server. Fluid lines couple the MCPs and the server pump. Alternatively, any means for transporting fluid within a sealed environment can be used. The server pump is any conventional pump, including, but not limited to, an electro-osmotic pump and a mechanical pump. In other embodiments, heat pipes or conduction means are used instead of the liquid-based cooling system.

In a first embodiment, the liquid based cooling system for each electronics server includes a rejector plate. The fluid lines coupling the MCPs and the server pump are also coupled to the rejector plate with fluid channels configured therein. The MCPs, the server pump, the rejector plate, and the fluid lines connected thereto form a first closed loop. Each server chassis includes at least one chassis cold plate. The rejector plate is coupled to the chassis cold plate via a thermal interface material. The rejector plates for each of the electronics servers are coupled to the chassis cold plate in this manner such that all rejector plates, and therefore the cooling system for each electronics server, are coupled to the chassis cold plate. Each electronics server is installed into a backplane along an insertion vector. The thermal interface between the rejector plate of the electronics server and the chassis cold plate is formed along a non-perpendicular plane relative to the insertion vector. In some embodiments, the thermal interface plane is parallel to the insertion vector. In order to couple the rejector plate to the chassis cold plate, a mounting mechanism is used.

The chassis cold plate includes fluid channels which are coupled via fluid lines to a liquid-to-air heat exchanging system. The liquid-to-air heat exchanging system includes a heat rejector, one or more fans, and an external pump. Fluid lines couple the chassis cold plate to the heat rejector, the heat rejector to the external pump, and the external pump to the chassis cold plate. The chassis cold plate, the heat rejector, the external pump, and the fluid lines connected thereto form a second closed loop. At least one blowing fan is preferably included to generate airflow over the surface of the heat rejector. The heat rejector is preferably a counter flow radiator. In some embodiments, the entire chassis cold plate and the liquid-to-air heat exchanging system is included within a single enclosure, such as the server housing. In other embodiments, a portion of the chassis cold plate extends external to the server housing and the liquid-to-air heat exchanging system is remotely located to the server housing.

In operation, within the liquid based cooling system for each electronics server, fluid is pumped through the fluid lines and the MCPs by the server pump such that heat generated by each heat generating device on the electronics server is transferred to the fluid flowing through each respective MCP coupled to the heat generating devices. Heat is transferred from the heat generating devices to the fluid flowing through the MCPs, and the heated fluid flows into the fluid channels within the rejector plate. Within the second closed loop system, fluid is pumped through the fluid channels in the chassis cold plate by the external pump. Thermal characteristics of the rejector plate, the chassis cold plate, and the thermal interface material between the rejector plate and the chassis cold plate are configured such that heat within the fluid flowing through each rejector plate is transferred to the fluid flowing through the chassis cold plate. Heated fluid within the chassis cold plate is pumped to the heat rejector within the liquid-to-air heat exchanging system, where heat is transferred from the fluid to the air. The cooled fluid exits the liquid-to-air heat exchanging system and is pumped back to the chassis cold plate.

FIG. 1 illustrates a perspective view of an exemplary cooling system 10 according to the first embodiment of the present invention. The cooling system 10 includes a chassis housing 12 for housing a back plane 20, a chassis cold plate 60, and a liquid-to-air heat exchanging system 70. The cooling system 10 is configured to cool up to N electronics servers. A first electronics server 30, a second electronics server 32, and an nth electronics server 34 are each mounted and electronically coupled to the back plane 20. For purposes of discussion, each electronics server 30, 32, 34 includes two processors. It is understood that each electronics server can be configured independently and that each electronics server can include more or less than two processors. Coupled to each electronics server 30, 32, 34 is a liquid based cooling system that includes at least one server pump 40, an MCP 42, an MCP 44, and a rejector plate 50. Preferably, the liquid based cooling system includes one MCP for each processor on the corresponding electronics server. In this exemplary case in which each electronics server 30, 32, 34 includes two processors, each liquid based cooling system includes two corresponding MCPs, preferably one per processor.

Preferably, the server pump 40 is a mechanical pump. Alternatively, the server pump 40 is an electro- osmotic pump. However, it is apparent to one skilled in the art that any type of pump is alternatively contemplated. Preferably, each MCP 42, 44 is a fluid-based, micro-channel heat exchanger of the type described in U.S. Pat. No. 7,000,684, which is hereby incorporated by reference. However, it is apparent to one skilled in the art that any type of fluid-based heat exchanger is alternatively contemplated. Preferably, the rejector plate 50 is configured with micro-channels that maximize a surface area exposed to a fluid passing therethrough.

A bottom surface of the rejector plate 50 is thermally coupled to a top surface of the chassis cold plate 60. In this manner, the rejector plate 50 for each electronics server 30, 32, 34 is thermally coupled to the chassis cold plate 60. The chassis plate 60 is preferably configured with micro-channels that maximize a surface area exposed to a fluid passing there through.

Each of the electronics servers 30, 32, 34 is coupled to the backplane 20 along an insertion vector. The insertion vector is perpendicular to the backplane 20. A thermal interface between the rejector plate 50 and the chassis cold plate 60 is formed along a non-perpendicular plane relative to the insertion vector. In some embodiments, the thermal interface plane is parallel to the insertion vector.

The liquid-to-air heat exchanging system 70 includes an external pump 72, a heat rejector 74, and a fan 76. The external pump 72 and the heat rejector 74 are coupled to the chassis cold plate 60. Preferably, the external pump 72 is a mechanical pump. Alternatively, the external pump 72 is an electro-osmotic pump. However, it is apparent to one skilled in the art that any type of pump is alternatively contemplated. The heat rejector 74 is preferably a radiator with micro-channels and fins positioned closely together. More preferably, the heat rejector 74 is a counter flow radiator of the type described in U.S. Pat. No. 6,988,535, which is hereby incorporated by reference. However, it is apparent to one skilled in the art that any type of heat rejector is alternatively contemplated. The fan 76 comprises one or more blowing fans for generating air flow across and/or through the heat rejector 74.

Figure 2:
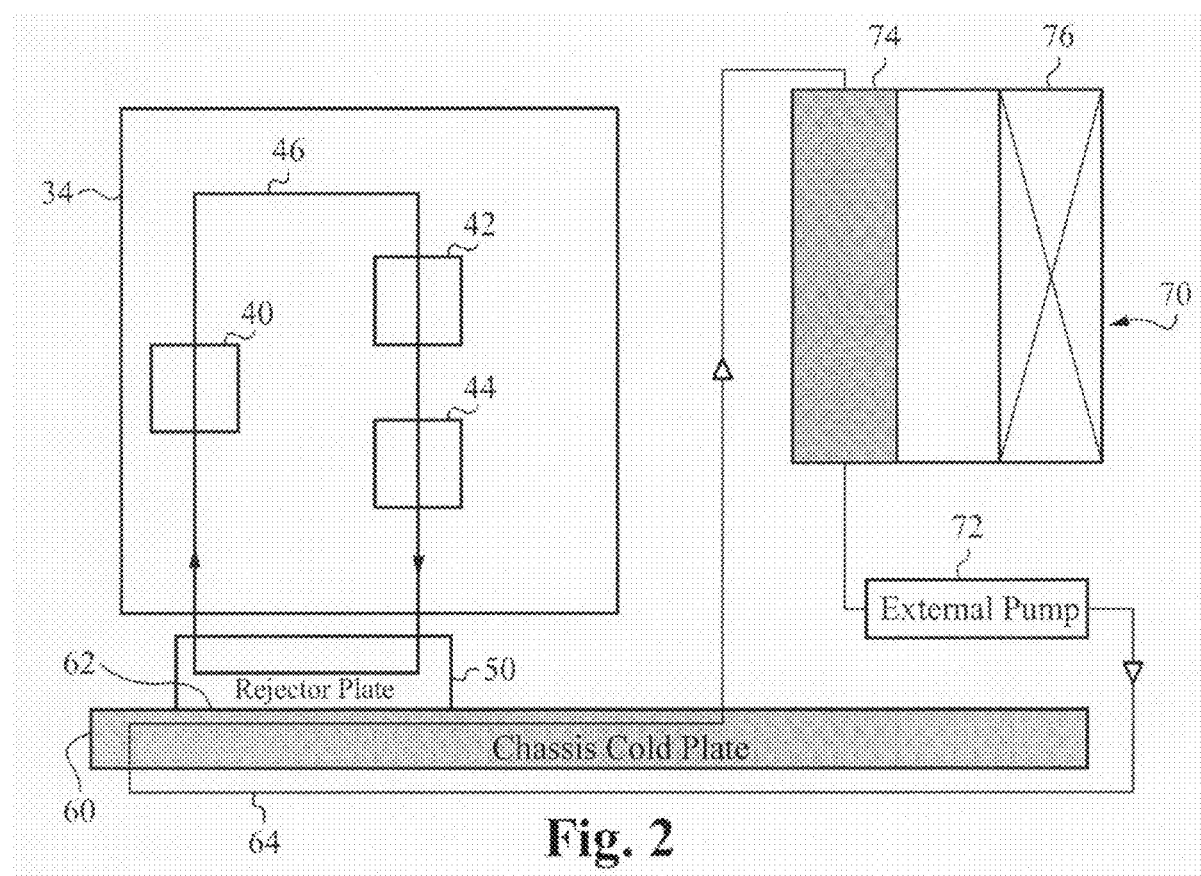
FIG. 2 illustrates a side view of the nth electronics server coupled to the liquid-to-air heat exchanging system.

FIG. 2 illustrates a side view of the nth electronics server 34 coupled to the liquid-to-air heat exchanging system 70. As shown in FIG. 2, the server pump 40 is coupled to the MCP 42 by one or more fluid lines 46. The MCP 42 is coupled to the MCP 44 by one or more fluid lines 46. The MCP 44 is coupled to the rejector plate 50 by one or more fluid lines 46. The rejector plate 50 is coupled to the server pump 40 by one or more fluid lines 46. The fluid lines 46 are metallic or non-metallic.

Although the MCP 42 and the MCP 44 are shown in FIG. 2 as being coupled in series, alternative configurations are also contemplated. For example, each MCP within a given liquid based cooling system can be configured in parallel such that fluid reaching any of the MCPs has not previously passed through, and been heated by, another MCP. In this manner, fluid reaching any MCP configured in parallel is cooler than if the fluid first passes through a serially connected MCP. In such an alternative configuration, the server pump 40 is coupled to the MCP 42 by one or more fluid lines 46, and separate fluid lines couple the server pump 40 to the MCP 44. In this alternative embodiment, one or more fluid lines couple the MCP 42 to the rejector plate 50 and one or more fluid lines couple the MCP 44 to the rejector plate 50. Alternatively, the one or more fluid lines leaving the MCP 42 and the one or more fluid lines leaving the MCP 44 are joined prior to coupling with the rejector plate 50. In yet other alternative configurations, multiple MCPs are configured in any combination of series and parallel configurations.

The MCP 42, the MCP 44, the rejector plate 50, the server pump 40, and the fluid lines 46 form a first closed loop through which fluid flows. A function of the liquid-based cooling system of FIG. 2, which includes the first closed loop, is to capture heat generated by the two processors (not shown) on the electronics server 34. The MCP 42 is thermally coupled to a first processor on the electronics server 34. Similarly, the MCP 44 is thermally coupled to a second processor on the electronics server 34. As fluid flows through the MCP 42, heat from the first processor is transferred to the fluid. As fluid flows through the MCP 44, heat from the second processor is transferred to the fluid.

The type of fluid used in the liquid-based cooling system is preferably water-based. Alternatively, the fluid within the liquid-based cooling system is based on combinations of organic solutions, including but not limited to propylene glycol, ethanol and isopropanol (IPA). Still alternatively, the fluid within the liquid-based cooling system is a pumped refrigerant. The fluid used in the liquid-based cooling system also preferably exhibits a low freezing temperature and has anti-corrosive characteristics. Depending on the operating characteristics of the liquid-based cooling system and the electronics server processors, in one embodiment, the fluid exhibits single phase flow while circulating within the liquid-based cooling system. In another embodiment, the fluid is heated to a temperature to exhibit two phase flow, wherein the fluid undergoes a phase transition from liquid to a vapor or liquid/vapor mix.

The heated fluid flows from the MCPs 42, 44 into the micro-channels within the rejector plate 50. Heat is transferred from the heated fluid within the micro-channels to the material of the rejector plate 50. A thermal interface material 62 provides efficient heat transfer between the rejector plate 50 and the chassis cold plate 60 so that heat from the rejector plate 50 is transferred to the material of the chassis cold plate 60. The thermal interface material 62 is preferably a compliant material such as thermal grease, solder, or any type of thermally conducting gap filling material.

As shown in FIG. 2, the chassis cold plate 60 is coupled to the external pump 72 by one or more fluid lines 64. The chassis cold plate 60 is coupled to the heat rejector 74 by one or more fluid lines 64. The heat rejector 74 is coupled to the external pump 72 by one or more fluid lines 64. The fluid lines 64 are metallic or non-metallic. The chassis cold plate 60, the heat rejector 74, the external pump 72, and the fluid lines 64 form a second closed loop through which fluid flows. The fluid in second closed loop preferably comprise the same type of fluid discussed above in relation to the first closed loop. The fluid in the second closed loop is independent of the fluid in the first closed loop.

A function of the second closed loop and the liquid-to-air heat exchanging system 70 is to transfer heat from the chassis cold plate 60 to the ambient. As fluid flows through the micro-channels within the chassis cold plate 60, heat from material of the chassis cold plate 60 is transferred to the fluid. The heated fluid flows to the heat rejector 74.

As the heated fluid flow through the heat rejector 74, heat is transferred from the fluid to the material of the heat rejector 74. The fan 76 blows air over the surface of the heat rejector 74 such that heat is transferred from the heat rejector 74 to the ambient. Preferably, the chassis 12 (FIG. 1) includes intake vents and exhaust vents through which air enters and leaves the cooling system 10 (FIG. 1). Cooled fluid leaving the heat rejector 74 flows back to the chassis cold plate 60.

Figure 3:
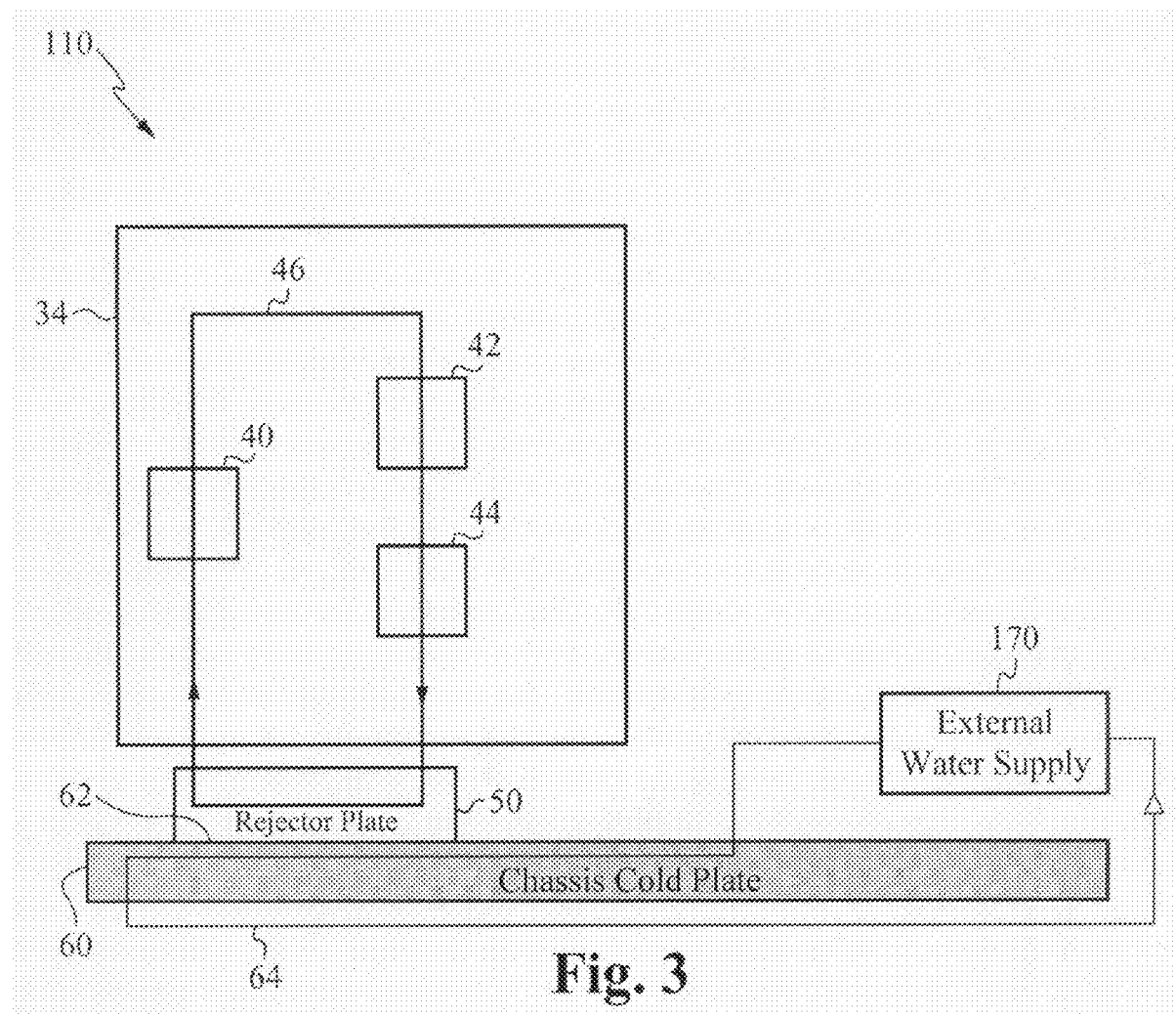
FIG. 3 illustrates a side view of an exemplary cooling system according to a second embodiment of the present invention.

FIG. 3 illustrates a side view of an exemplary cooling system according to a second embodiment of the present invention. The cooling system 110 can be identical to the cooling system 10 of FIG. 1 with the exception that the liquid-to-air heat exchanging system 70 (FIG. 1) of cooling system 10 is replaced by an external water supply 170. The external water supply 170 represents a continuous running water supply, such as the public water supply provided to most commercial and residential facilities. Alternatively, the external water supply 170 represents an external source of any type of fluid to which heat is transferred. In operation of the cooling system 110, fresh water from the external water supply 170 flows to the chassis cold plate 60. Heat from the chassis cold plate 60 is transferred to the water in the same manner as that described in relation to cooling system 10 (FIG. 1). The heated water flows from the chassis cold plate 60 to the external water supply 170, where the heated water is disposed. Pressure from the water entering the fluid lines 64 from the external water supply 170 is sufficient to circulate the water through the chassis cold plate 60 and back to the external water supply for disposal. Alternatively, an external pump is coupled to the fluid lines 64 between the external water supply 170 and the chassis cold plate 60 to pump the water to the chassis cold plate 60.

In a third embodiment, the chassis cold plate is modified with quick connects and the rejector plate is removed from each electronics server such that the fluid lines within the liquid based cooling system of each electronics server are coupled directly to the micro-channels within the chassis cold plate via the quick connects. The fluid lines within each liquid based cooling system are modified with appropriate fittings to couple with the quick connects on the chassis cold plate. In an alternative configuration of the third embodiment, the quick connects are configured onto the fluid lines of the liquid based cooling system, and the chassis cold plate is configured with appropriate fittings to couple with the quick connects on each electronics server.

Figure 5:
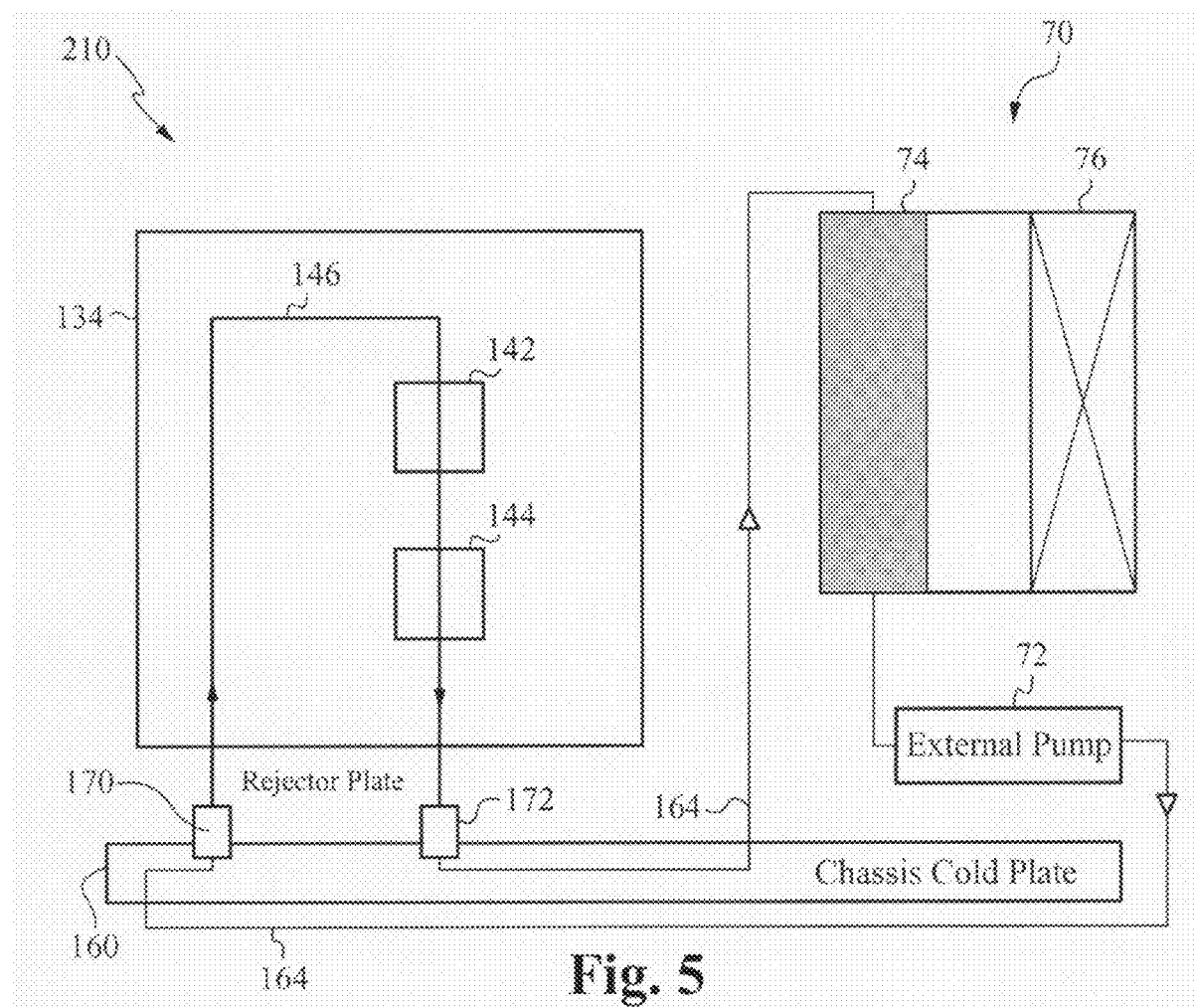
FIG. 5 illustrates a side view of an exemplary cooling system according to the third embodiment of the present invention.

FIG. 5 illustrates a side view of an exemplary cooling system 210 according to the third embodiment of the present invention. Although cooling system 210 is shown in FIG. 5 as including only a single electronics server 134, it is understood that the cooling system 210 also includes a chassis housing (not shown) and a back plane (not shown) configured to hold up to N electronics servers in a manner similar to that described in relation to cooling system 10 in FIG. 1. For purposes of discussion, each electronics server within the cooling system 210 is described as including two processors. It is again understood that each electronics server in the cooling system 210 can be configured independently and that each electronics server can include more or less than two heat generating devices, such as processors.

A liquid based cooling system is coupled to the electronics server 134. The liquid based cooling system includes an MCP 142 and an MCP 144 coupled together via one or more fluid lines 146. The liquid based cooling system includes one MCP coupled to each processor on the electronics server 134. Each MCP 142, 144 is functionally equivalent to the MCPs 42, 44 (FIGS. 1-3)

The cooling system 210 includes the liquid-to-air heat exchanging system 70 coupled to a chassis cold plate 160 via one or more fluid lines 164. The chassis cold plate 160 is configured with micro-channels that enhance a surface area exposed to a fluid passing there through. The chassis cold plate 160 is also configured with quick connects 170 and 172. The fluid lines 146 are configured with appropriate fittings to couple with the quick connects 170 and 172. In the cooling system 210, the fluid lines 146 are coupled directly to the micro-channels of the chassis cold plate 160 via the quick connects 170, 172. In this manner, the liquid based cooling system coupled to electronics server 134, the chassis cold plate 160, the heat rejector 74, the external pump 72, and the fluid lines 164 form a single closed loop. Within this closed loop, the fluid is pumped by the external pump 72. The type of fluid used in the cooling system of the third embodiment is the same type of fluid used in the cooling system 10 of the first embodiment.

Although FIG. 5 shows a single quick connect 170 through which fluid flows from the chassis cold plate 160 to the fluid lines 146, the quick connect 170 is representative of one or more physical quick connects through which fluid flows from the micro-channels in the chassis cold plate 160 to the one or more fluid lines 146. Similarly, although FIG. 5 shows a single quick connect 172 through which fluid flows from the fluid lines 146 to the chassis cold plate 160, the quick connect 172 is representative of one or more physical quick connects through which fluid flows from the one or more fluid lines 146 to the micro-channels in the chassis cold plate 160.

Although the MCP 142 and the MCP 144 are shown in FIG. 5 as being coupled in series, alternative configurations are also contemplated. For example, each MCP within a given liquid based cooling system is configured in parallel. In such an alternative configuration, the quick connects 170 are coupled to the MCP 142 by one or more fluid lines 146, and separate fluid lines couple the quick connects 170 to the MCP 144. In this alternative embodiment, one or more fluid lines couple the MCP 142 to the quick connects 172 and one or more fluid lines couple the MCP 144 to the quick connects 172. Alternatively, there is not a one to one relationship between the number of quick connects 170 to the number of MCPs in the liquid based cooling system, and there is not a one to one relationship between the number of MCPs and the number of quick connects 172. In yet other alternative configurations, multiple MCPs are configured in any combination of series and parallel configurations.

A function of the liquid-based cooling system of FIG. 5, which includes the MCPs 142, 144 and the fluid lines 146, is to capture heat generated by the two processors (not shown) on the electronics server 134. The MCP 142 is thermally coupled to a first processor on the electronics server 134. Similarly, the MCP 144 is thermally coupled to a second processor on the electronics server 134. As fluid flows through the MCP 142, heat from the first processor is transferred to the fluid. As fluid flows through the MCP 144, heat from the second processor is transferred to the fluid.

The heated fluid flows from the fluid lines 146 into the micro-channels within the chassis cold plate 160 via the quick connect 172. As shown in FIG. 5, the chassis cold plate 160 is coupled to the external pump 72 by one or more fluid lines 164. In addition, the chassis cold plate 160 is coupled to the heat rejector 74 by one or more fluid lines 164. The heated fluid in the micro-channels of the chassis cold plate 160 flows to the heat rejector 74 via fluid lines 164. The fluid lines 164 are metallic or non-metallic.

As previously described, a function of the liquid-to-air heat exchanging system 70 is to transfer heat from a fluid to the ambient. As the heated fluid flow through the heat rejector 74, heat is transferred from the fluid to the material of the heat rejector 74. The fan 76 blows air over the outer surface of the heat rejector such that heat is transferred from the heat rejector 74 to the ambient. Cooled fluid leaving the heat rejector 74 flows back to the chassis cold plate 160 via fluid lines 164. The cooled fluid flows through the chassis cold plate 160 to the fluid lines 146 via the quick connect 170. The cooled fluid flows to the MCPs 142 and 144.

It is apparent to one skilled in the art that the present cooling system is not limited to the components shown in FIG. 1-5 and alternatively includes other components and devices. For example, although not shown in FIG. 1, the cooling system 10 can also include a fluid reservoir coupled to either the closed loop of the liquid based cooling system, the closed loop of the chassis cold plate 60, the heat rejector 74, the external pump 72, and the fluid lines 64, or both closed loops. The fluid reservoir accounts for fluid loss over time due to permeation.

When connecting an electronics server to a rack system through the use of quick disconnects, additionally factors are to be considered. One consideration is that such a liquid connection is made in the data room. Anytime a connection is made or broken, there is a chance for a leak. The connection also usually occurs as a separate step from the electrical connections which occur when the electronics server is inserted and locked into the rack. As a separate connection, this is not fail safe. For example, the processor can be turned on without having connected the cooling loop causing an overheating event or damage to the CPU. Another consideration is that if the cooling loop is correctly connected, the cooling loop on the electronics server will share the same fluid as the full rack system. Sharing the rack system fluid can lead to reliability issues, specifically clogging. The length scales of features in an efficient heat exchanger used to transfer heat from a processor are measured in microns. Chilled water lines can have scale and other particulate which may not be an issue at rack level cooling but can quickly clog a heat exchanger at the board level. Another consideration is that the level of control of materials used for larger scale cooling applications is also different then that for a electronics server cooling loop and corrosion may become an issue. For the independent cooling loop systems described above in relation to FIGS. 2 and 3, these considerations are eliminated.

Additionally, although each of the embodiments described above in regards to FIGS. 1-5 are directed to liquid-based cooling systems, alternative cooling systems, such as heat pipes and conduction means, can be used.

Fundamental to the operation of the independent cooling loops system described above is the thermal interface formed between the rejector plate of the electronics server and the chassis cold plate of the server rack. These cooling systems provide mechanisms and form factors for bringing a heat exchanger from the rack into thermal contact with a heat exchanger from the electronics server. For low thermal resistance, a thermal interface material (TIM), such as thermal grease or a thermal pad, may be used. To ensure good thermal contact, pressure is applied between the two heat exchangers, the rejector plate and the chassis cold plate. The pressure required to hold the heat exchangers can be 20-30 psi or higher. Methods for applying pressure include, but are not limited to, mechanical clamping, springs, electro-mechanical motors or actuators, pneumatics and hydraulics. The heat exchangers can take a variety of shapes, including planar, cylindrical, curvilinear, or other non-planar configurations. The mating surfaces of the heat exchangers can be smooth or with physical features such as mating teeth to increase surface area or ensure alignment. Thermal contact can be made on one or more surfaces creating a sandwich type structure. A heat exchanger can be a single solid piece or can be made up of an array of smaller heat exchangers to allow flexibility when mating non-planar surfaces.

The mounting mechanism used to engage and disengage the heat exchangers is configured to isolate the force applied to the two heat exchangers. The mounting mechanism includes an interlocking mechanism that prevents transfer of the applied force to the rest of the electronics server or rack chassis. Without isolating this force, the force is applied to the electronics server and/or the rack chassis, possibly disconnecting the electrical connections between the electronics server and the rack, as well as providing mechanical stress to the electronics server and/or the rack chassis. The mounting mechanism can also be coupled to the electronics server locking mechanism such that the action of locking the electronics server into the rack causes the heat exchangers to engage in thermal contact. This is a fail safe procedure since no separate process is required to engage the electronics server cooling loop. Similarly, unlocking the electronics server causes the heat exchangers to disengage allowing the electronics to be removed without interference from either the electronics server cooling loop or the rack cooling loop.

Figure 4:
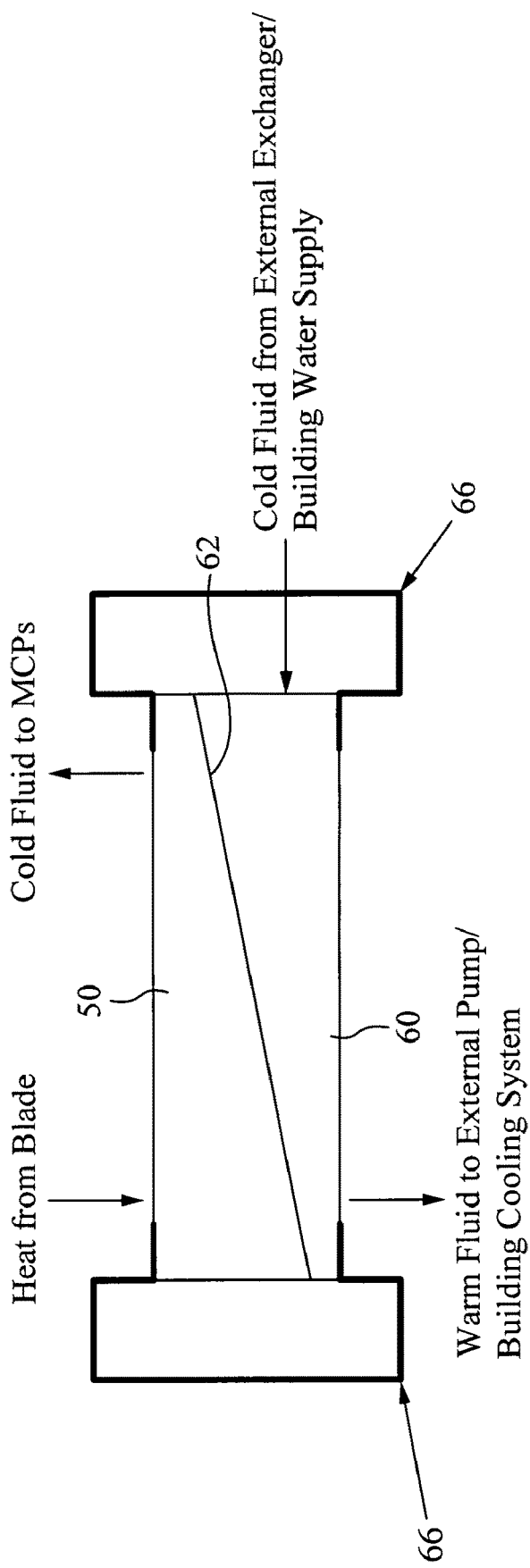
FIG. 4 illustrates an exemplary heat transfer configuration between a mating surface of the rejector plate and a mating surface of the chassis cold plate.

FIG. 4 illustrates an embodiment of a heat transfer configuration between a mating surface of the rejector plate 50 and a mating surface of the chassis cold plate 60 coupled together via the thermal interface material 62. In the configuration shown in FIG. 4, the two mating surfaces of the rejector plate 50 and the chassis cold plate 60 are configured as wedges. A thick portion of the rejector plate wedge 50 is aligned with a thin portion of the chassis cold plate wedge 60. A thin portion of the rejector plate wedge 50 is aligned with a thick portion of the chassis cold plate wedge 60. By sliding the electronics server into the back plane the wedge shapes cause pressure between the rejector plate wedge 50 and the chassis cold plate 60. This pressure serves to form an enhanced thermal interface. In the first closed loop, heated fluid flows from the MCPs 42 and 44 (FIGS. 2 and 3) to the thick portion of the rejector plate wedge 50. Cooled fluid flows out of the thin portion of the rejector plate wedge 50 to the server pump 40 (FIGS. 2 and 3). In the second closed loop, fluid flows from the liquid-to-air heat exchanging system 170 (FIG. 2), or the external water supply 170 (FIG. 3), to the thick portion of the chassis cold plate wedge 60. Heated fluid flows out of the thin portion of the chassis cold plate 60 to the liquid-to-air heat exchanging system 70 (FIG. 2), or the external water supply 170 (FIG. 3). Each of the rejector plate wedge 50 and the chassis cold plate wedge 60 include channeled features to enable efficient heat transfer from the flowing fluid of the first closed loop, to the wedge interface, the flowing fluid of the second closed loop. In alternative embodiments, the rejector plate 50 and the chassis cold plate 60 are configured using dimensions and shapes different than wedges.

A mounting assembly 66 secures the rejector plate wedge 50 to the chassis cold plate 60. The mounting assembly 66 can include clips, screw, or any other conventional retention mechanism.

Figure 6:
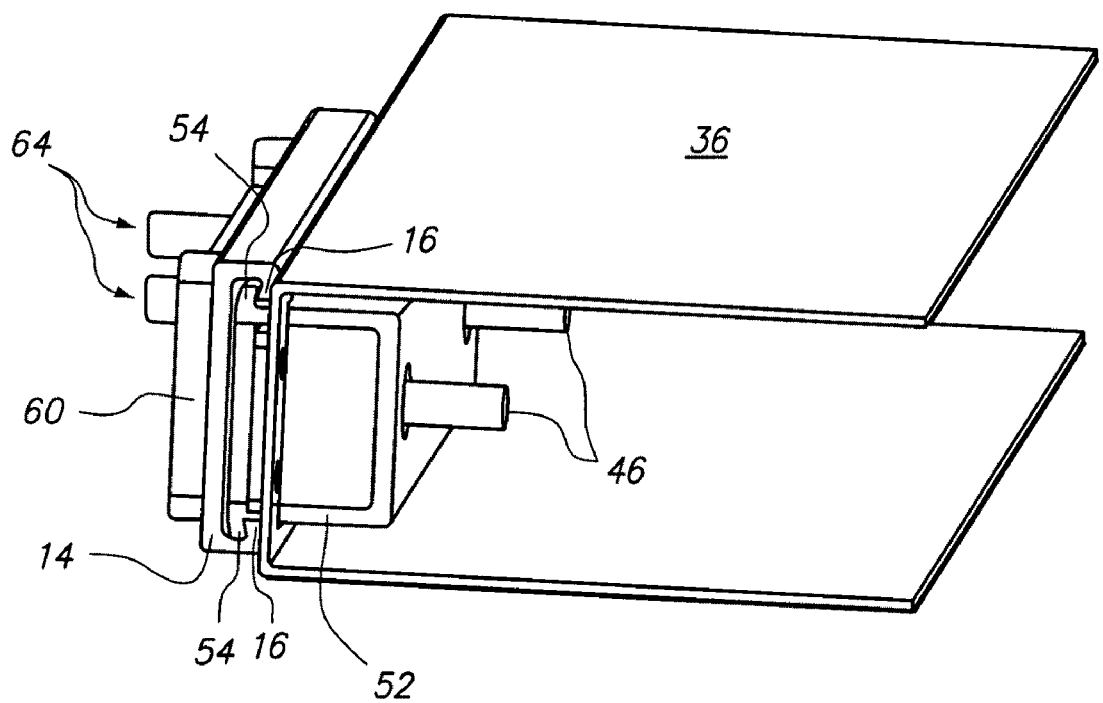
FIG. 6 illustrates a side view of a first mounting assembly used to couple a electronics server to a server rack to form a thermal interface.
Figure 7:
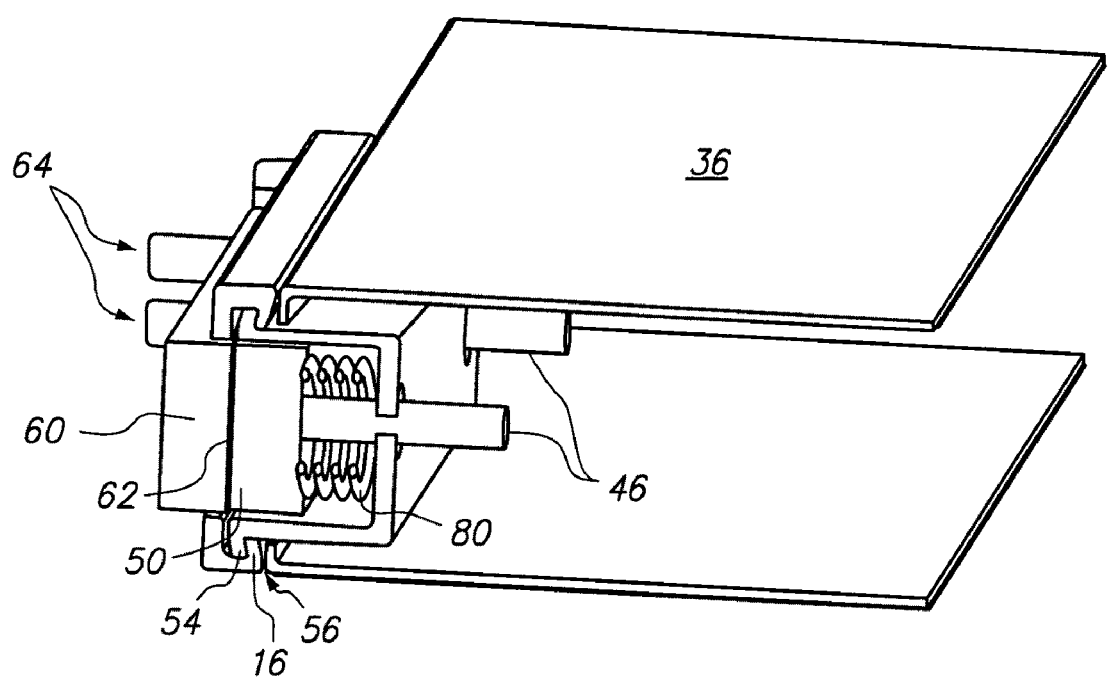
FIG. 7 illustrates a cut-out side view of the mounting assembly from FIG. 6 in an engaged configuration.
Figure 8:
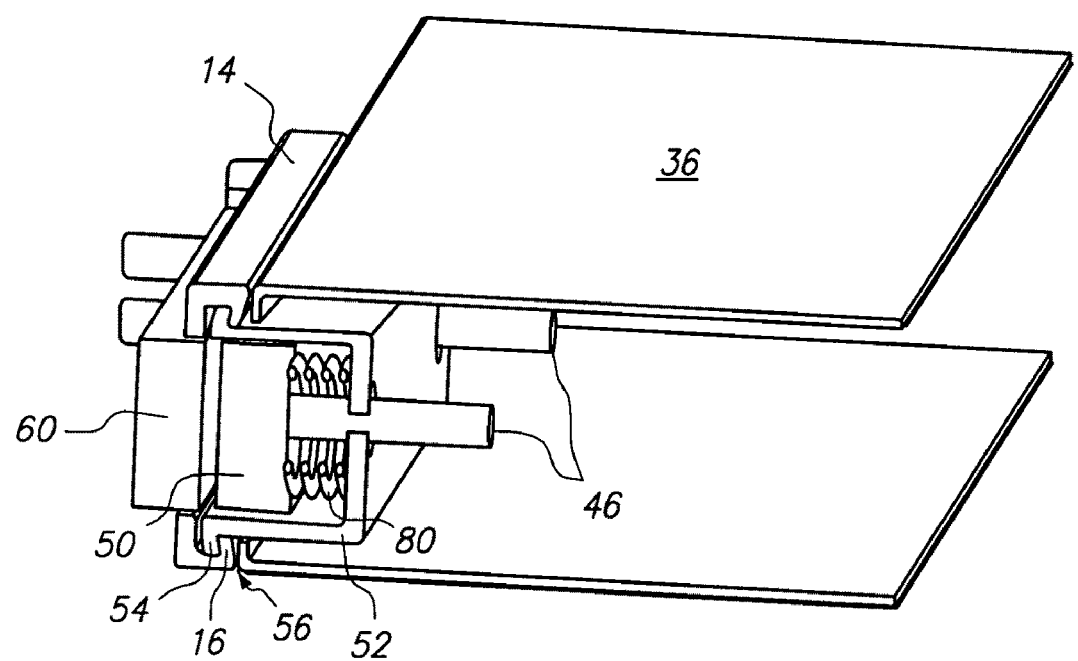
FIG. 8 illustrates a cut-out side view of the mounting assembly from FIG. 6 in a disengaged configuration.

FIGS. 6-8 illustrate one embodiment of a mounting assembly used to engage each electronics server to the server rack. As described above, the thermal interface between the two heat exchangers, the rejector plate of the electronics server and the chassis cold plate of the rack, is formed by sufficiently forcing the rejector plate against the chassis cold plate, via the thermal interface material, such as TIM 62 (FIG. 4). To prevent transfer of the force to the rest of the electronics server or the rack chassis, an interlocking channel within a mounting assembly is used. The mounting assembly contains the force thus preventing strain from being transferred to the electrical connection on the back plane of the rack or to the components within the electronics server or rack chassis. On the rack side, there is an extruded rack channel, attached to the rack. The rack channel is used as part of the electronics server guide mechanism on the rack. Seated within the rack channel is the rack side heat exchanger, the chassis cold plate. Attached to a side of the electronics server chassis is a complementary extruded structure, referred to as a chassis guide, which is configured to slide into the rack side rack channel. Held within the chassis guide is the electronics server rejector plate and one or more springs. The rejector plate is held in a recessed position via a retracting mechanism. To install the electronics server into the rack, the chassis guide slides into the rack channel. After the rack locks are activated to seat the electronics server in the rack and lock the electronics server in place, the retracting mechanism releases the rejector plate allowing the springs to push the rejector plate against the chassis cold plate, thereby providing the pressure required to form the thermal interface.

In particular, FIG. 6 illustrates a side view of the mounting assembly used to couple a electronics server to a server rack to form a thermal interface. FIG. 7 illustrates a cut-out side view of the mounting assembly from FIG. 6 in an engaged configuration. FIG. 8 illustrates a cut-out side view of the mounting assembly from FIG. 6 in a disengaged configuration. The views shown in FIGS. 6-8 do not show the entire electronics server 34 (FIG. 2), instead, only a portion of a electronics server chassis 36, the inlet and outlet fluid lines 46, and the rejector plate 50 are shown. A chassis guide 52 is configured to extend through a side of the electronics server chassis 36. The chassis guide 52 is also configured to house the rejector plate 50 and springs 80. A rack channel 14 is coupled to the rack (not shown) and is configured around the chassis cold plate 60. The rack channel 14 includes extrusions 16, and the chassis guide 52 includes extrusions 54. The extrusions 16 and the extrusions 54 are configured to dovetail with each other to form an interlocking channel. The force applied to the rejector plate 50 and the chassis cold plate 60 by the springs 80 is applied within the rack channel 14 and the chassis guide 52. Because the extrusions 54 are free-floating relative to the electronics server chassis 36, the force is constrained within the mounting assembly, and the force is not transferred outside the assembly to the electronics server 34 or to the back plane 20 (FIG. 1). By applying the force to the two cold plates, a complimentary reaction force is also generated. This reaction force is contained within the mounting assembly. Without the mounting assembly, the reaction force is applied to the electronics server and possibly, depending on the location of the interface, to the back plane of the rack via the electrical connections. This can negatively impact the system by disrupting the electrical interface between the electronics server and the rack.

The chassis guide 52 is floating relative to the electronics server chassis 36, configured as a float area 56 (FIG. 7) between the interlocking channel and the electronics server chassis 36. The float area 56 enables movement of the chassis guide 52 relative to the electronics server chassis 36. This clearance is used to enable the chassis guide 52 to be loaded into the rack channel 14 as the electronics server 34 is installed in the rack. Once the electronics server 34 is loaded into the rack, and the chassis guide 52 and the rack channel 14 slide together, the retracting mechanism is disengaged and the spring 80 forces the rejector plate 50 against the chassis cold plate 60, as shown in FIG. 7. In contrast, FIG. 8 illustrates the mounting assembly while the retracting mechanism is engaged. In this configuration, the mounting assembly is disengaged and the rejector plate 50 is not thermally coupled to the chassis cold plate 60.

While the retracting mechanism is disengaged and the spring 80 applies force to the rejector plate 50, the rack channel 14 and the chassis guide 52 expand relative to each other and the corresponding extrusions 54 and 16 thereby engage to form the interlocking channel. The interlocking channel in turn constrains the force within the mounting assembly. The float area 56 takes up whatever small movement of the mounting assembly must occur for this expansion, and therefore the formation of the interlocking channel, to occur. In this manner, the float area 56 enables the chassis guide 52 to slide into the rack channel 14 during installation, and then application of the force to press together the rejector plate 50 and the chassis cold plate 60, thereby forming the thermal interface.

Alternatively, a float area can be configured at a position other than between the electronics server chassis and the rack channel. For example, a float area can be positioned between the rack chassis and the rack channel on the rack side of the mounting assembly. In general, a float is positioned somewhere in the mounting assembly to enable clearance between the chassis guide and the rack channel during installation and removal of the electronics server into and from the rack.

Figure 9:
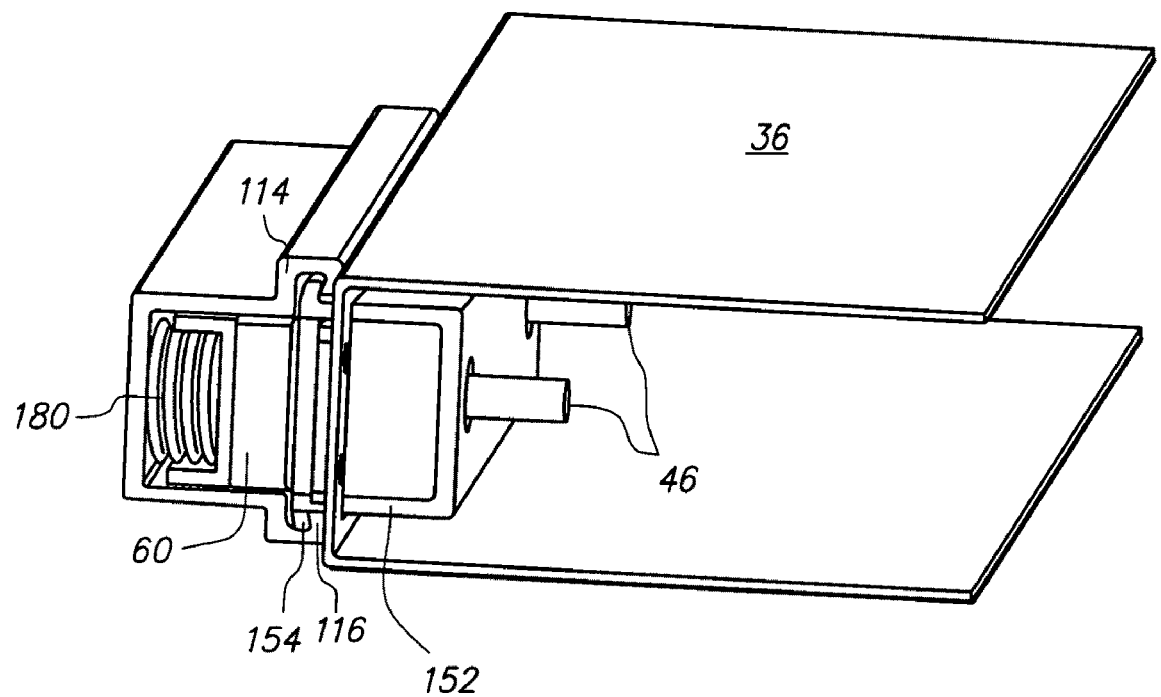
FIG. 9 illustrates a side view of a second mounting assembly used to couple a electronics server to a server rack to form a thermal interface.
Figure 10:
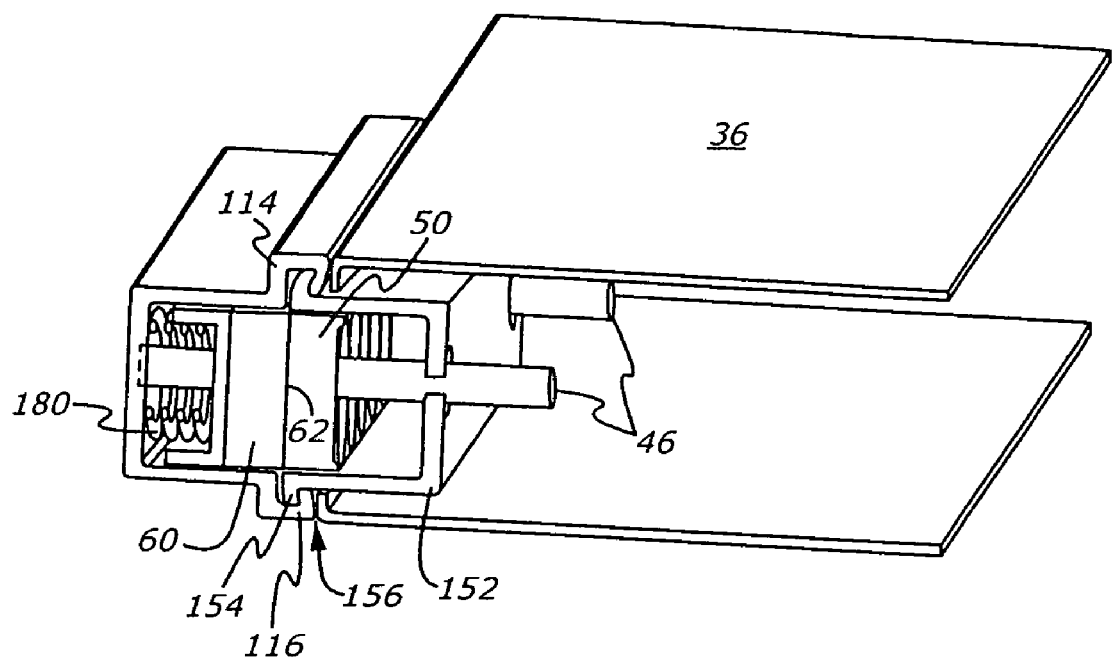
FIG. 10 illustrates a cut-out side view of the mounting assembly from FIG. 9 in an engaged configuration.
Figure 11:
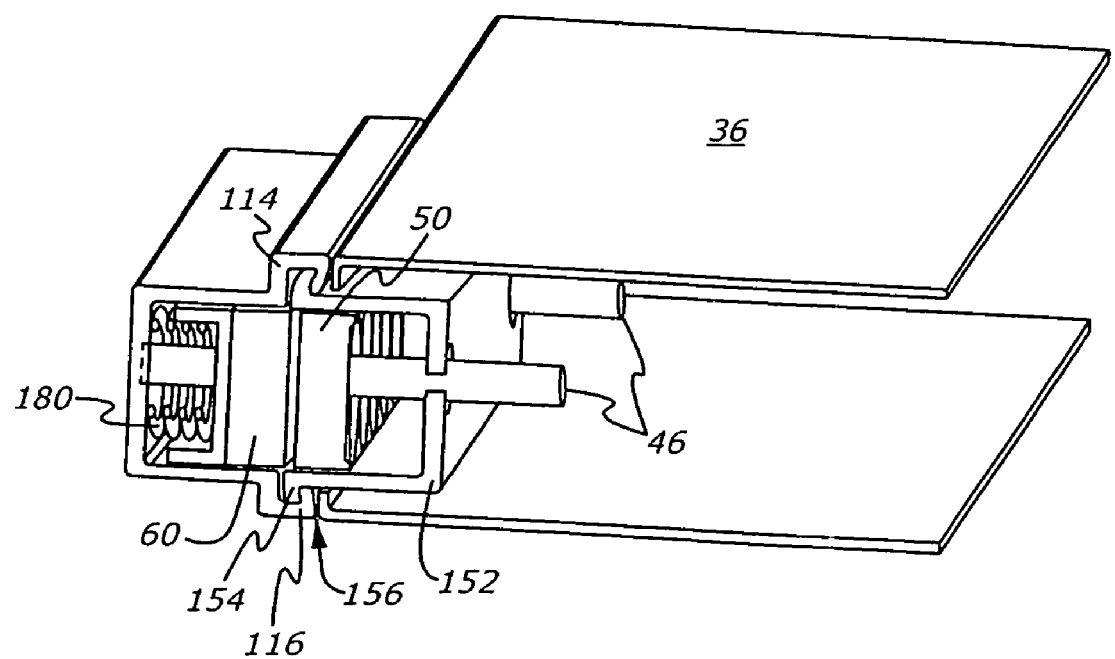
FIG. 11 illustrates a cut-out side view of the mounting assembly from FIG. 9 in a disengaged configuration.

FIGS. 9-11 illustrate another embodiment of a mounting assembly used to engage each electronics server to the server rack. The mounting assembly shown in FIGS. 9-11 is similar to that of the mounting assembly of FIGS. 6-8 except that the rack side rack channel is made deeper and springs are added behind the chassis cold plate within the rack channel instead of behind the rejector plate in the chassis guide. In some embodiments, the chassis cold plate is held in place by shoulder screws from behind so that the springs are pre-loaded. When the electronics server is inserted into the rack, an actuating mechanism translates, or forces, the rejector plate against the chassis cold plate, via the intervening thermal interface material. The last portion of movement by the rejector plate causes the springs to compress by a corresponding amount, thereby applying the force to form the thermal interface between the rejector plate and the chassis cold plate. Such a configuration enables easy removal of the electronics server from the rack because deactivation of the mounting assembly does not oppose a spring force.

In particular, FIG. 9 illustrates a side view of the mounting assembly used to couple a electronics server to a server rack to form a thermal interface. FIG. 10 illustrates a cut-out side view of the mounting assembly from FIG. 9 in an engaged configuration. FIG. 11 illustrates a cut-out side view of the mounting assembly from FIG. 9 in a disengaged configuration. A chassis guide 152 is configured to extend through a side of the electronics server chassis 36. The chassis guide 152 is also configured to house the rejector plate 50. A rack channel 114 is coupled to the rack (not shown). The rack channel 114 is configured to house the chassis cold plate 60 and springs 180. The rack channel 114 includes extrusions 116, and the chassis guide 152 includes extrusions 154. The extrusions 116 and the extrusions 154 are configured to dovetail with each other to form an interlocking channel. The force applied to the rejector plate 50 and the chassis cold plate 60 by the springs 180 is applied within the rack channel 114 and the chassis guide 152. Because the extrusions 154 are free-floating relative to the electronics server chassis 36, the force is constrained within the mounting assembly, and the force is not transferred outside the assembly to the electronics server 34 or to the back plane 20 (FIG. 1).

The chassis guide 152 is floating relative to the electronics server chassis 36, configured as a float area 156 (FIG. 10) between the interlocking channel and the electronics server chassis 36. The float area 156 enables movement of the chassis guide 152 relative to the electronics server chassis 36. This clearance is used to enable the chassis guide 152 to be loaded into the rack channel 114 as the electronics server 34 is installed in the rack. The float area 156 and the interlocking channel formed by the extrusions 154 and 116 are formed and are operated similarly to the float area 56 and the interlocking channel formed by the extrusions 54 and 16 described above related to FIGS. 6-8.

The chassis cold plate 60 is held in place by shoulder screws (not shown) from behind so that the springs are pre-loaded. In this manner, the chassis cold plate 60 maintains a fixed, outward extending position when not acted upon. This fixed position is shown in FIG. 11. As the electronics server 34 is loaded into the rack, and the chassis guide 152 and the rack channel 114 slide together, a translation mechanism (not shown) forces the rejector plate 50 towards and against the chassis cold plate 60, via the intervening TIM 62, as shown in FIG. 10. The last portion of movement by the rejector plate 50 causes the springs 180 to compress by a corresponding amount, thereby forming the thermal interface between the rejector plate 50 and the chassis cold plate 60. In contrast, FIG. 11 illustrates the mounting assembly while the translation mechanism is disengaged. In this configuration, the chassis cold plate 50 is positioned at its un-actuated position and the rejector plate 50 is not forced by the translation mechanism. As such, the rejector plate 50 is not thermally coupled to the chassis cold plate 60.

Although the mounting assemblies described in relation to FIG. 6-11 include a spring to apply the force to the rejector plate, any conventional means can be used, including but not limited to alternative spring means, pneumatics, mechanical clamping, and hydraulics.

Any number of translation mechanisms can be employed to create the necessary translation of the rejector plate and the chassis cold plate for full engagement. One method is through the use of horizontal or vertical cams. These allow the conversion of a rotational motion to a linear motion. The cams can be further attached to a linear mechanical linkage providing the conversion of a motion in the X direction to a motion in the Y axis. The shape of the cams can be custom tailored to allow for different styles of translation. For example, if identically shaped cams are used, the rejector plate is uniformly moved in parallel relative to the side of the chassis cold plate. If slightly different shaped cams are used, a progressive motion is made such that one edge of the rejector plate moves forward toward the chassis cold plate, then the other edge of the rejector plate moves. This is useful when disengaging the system and trying to break free a TIM joint.

Figure 12:
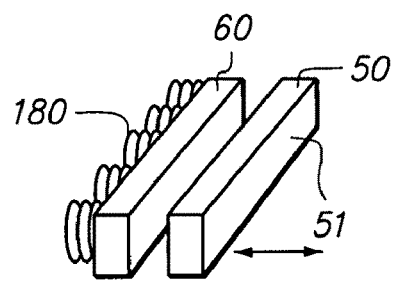
FIG. 12 illustrates a perspective view of the of the rejector plate and the chassis cold plate within the mounting assembly of FIGS. 9-11.
Figure 13A:
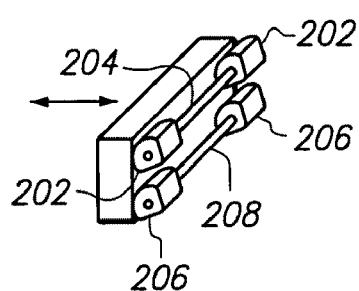
FIG. 13A illustrates a perspective view of a first embodiment of a horizontal cam configuration.
Figure 13B:
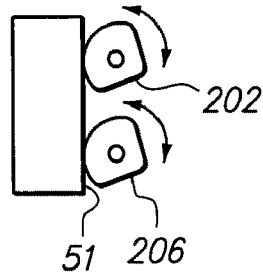
FIG. 13B illustrates a side view of the first embodiment of the horizontal cam configuration of FIG. 13A.

FIG. 12 illustrates a perspective view of the of the rejector plate and the chassis cold plate within the mounting assembly of FIGS. 9-11. As shown in FIG. 12, the rejector plate 50 is moved in the horizontal direction. Moving the rejector plate 50 from right to left engages the thermal interface. Moving the rejector plate 50 from left to right disengages the thermal interface. One or more cams can be coupled to a back surface 51 of the rejector plate 50. FIG. 13A illustrates a perspective view of a first embodiment of a horizontal cam configuration. Multiple cams 202 are positioned horizontally against the back surface 51. The cams 202 are coupled via a linkage 204. Multiple cams 206 are positioned horizontally against the back surface 51. The cams 206 are coupled via a linkage 208. FIG. 13B illustrates a side view of the first embodiment of the horizontal cam configuration of FIG. 13A. The shape of the cams 202 and 206 determine translation of the rejector plate 50 from side to side or from top to bottom. The shape and orientation of the cams 202 relative to the cams 206 determines the translation of the top side of the rejector plate 50 relative to the bottom side. If the cams 202 and the cams 206 are shaped and oriented the same, then the entire rejector plate 50 moves uniformly. If the cams 202 and the cams 206 are not shaped or oriented the same, then one side of the rejector plate 50 moves differently than the other side. It is understood that more than two cams 202 can be used and/or more than two cams 206 can be used. It is also understood that more than two rows of cams can be used.

Figure 14A:
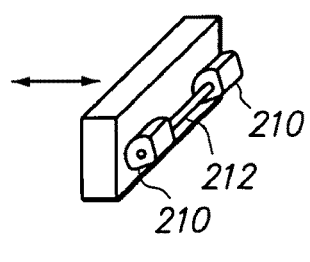
FIG. 14A illustrates a perspective view of a second embodiment of a horizontal cam configuration.
Figure 14B:
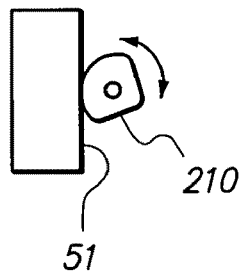
FIG. 14B illustrates a side view of the second embodiment of the horizontal cam configuration of FIG. 14A.

FIG. 14A illustrates a perspective view of a second embodiment of a horizontal cam configuration. Multiple cams 210 are positioned horizontally against the middle of the back surface 51. The cams 210 are coupled via a linkage 212. FIG. 14B illustrates a side view of the second embodiment of the horizontal cam configuration of FIG. 14A. The shape of the cams 210 determine translation of the rejector plate 50. The shape and orientation of each of the cams 210 relative to each other determines the translation of the side portion of the rejector plate 50 relative to the other side. If the cams 210 are each shaped and oriented the same, then the entire rejector plate 50 moves uniformly. If the cams 210 are not shaped or oriented the same, then one side of the rejector plate 50 moves differently than the other side. It is understood that more than two cams 210 can be used.

Figure 15A:
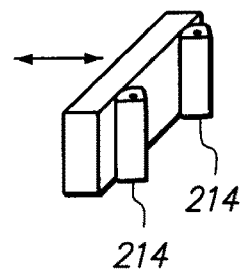
FIG. 15A illustrates a perspective view of a first embodiment of a vertical cam configuration.
Figure 15B:
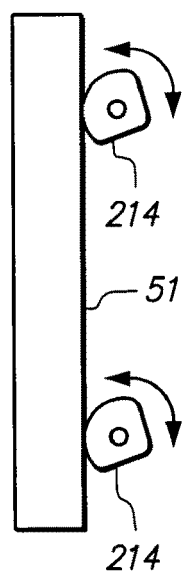
FIG. 15B illustrates a top down view of the first embodiment of the vertical cam configuration of FIG. 15A.

FIG. 15A illustrates a perspective view of a first embodiment of a vertical cam configuration. Multiple cams 214 are positioned vertically against the back surface 51. FIG. 15B illustrates a top down view of the first embodiment of the vertical cam configuration of FIG. 15A. The shape of the cams 214 determine translation of the rejector plate 50 from side to side. The shape and orientation of each of the cams 214 determines the translation of one side of the rejector plate 50 relative to the other side. If the cams 214 are shaped and oriented the same, then the entire rejector plate 50 moves uniformly. If the cams 214 are not shaped or oriented the same, then one side of the rejector plate 50 moves differently than the other side. It is understood that more than two cams 214 can be used can be used.

Figure 16A:
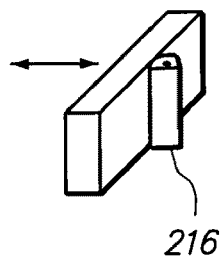
FIG. 16A illustrates a perspective view of a second embodiment of a vertical cam configuration.
Figure 16B:
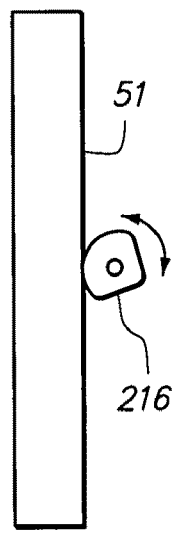
FIG. 16B illustrates a top down view of the second embodiment of the vertical cam configuration of FIG. 16A.

FIG. 16A illustrates a perspective view of a second embodiment of a vertical cam configuration. A single cam 216 is positioned vertically against the middle of the back surface 51. This allows the pressure between the rejector plate 50 and the chassis cold plate 60 to self-balance, as the force is applied as a single point on the back of the rejector plate 50. FIG. 16B illustrates a top down view of the second embodiment of the vertical cam configuration of FIG. 16A. The shape of the cam 216 determine translation of the rejector plate 50.

As applied to FIGS. 12-16B, the cams move the rejector plate 50 from right to left, toward the chassis cold plate 60. However, the cams do not retract the rejector plate 50 from the chassis cold plate 60. To retract the rejector plate 50 from the chassis cold plate 60, one or more springs (not shown) are attached to the back surface 51 of the rejector plate 50. As such, to move the rejector plate 50 toward the chassis cold plate 60, the cams must overcome the spring force of the attached spring. To move the rejector plate 50 away from the chassis cold plate 60, the cams are disengaged by rotating them to their initial positions. In response, the spring pulls the rejector plate 50 away from the chassis cold plate 60, for example from left to right in the FIGS. 12-16B. Without the spring attached to the back surface 51, when the cams are disengaged, the rejector plate 50 is not subject to any translation force.

Although not shown in FIGS. 12-16B, the cams can be coupled to a common linkage assembly. The common linkage assembly, such as an actuating rod, is used to actuate the cams. The linkage assembly can be manually operated. The linkage assembly can also be coupled to the electronics server locking mechanism used to lock the electronics server into the rack when the electronics server is installed. In this manner, the cams are actuated concurrently with the rack locking mechanism such that the action of locking the electronics server into the rack causes the rejector plate and the chassis cold plate to engage in thermal contact.

Figure 17A:
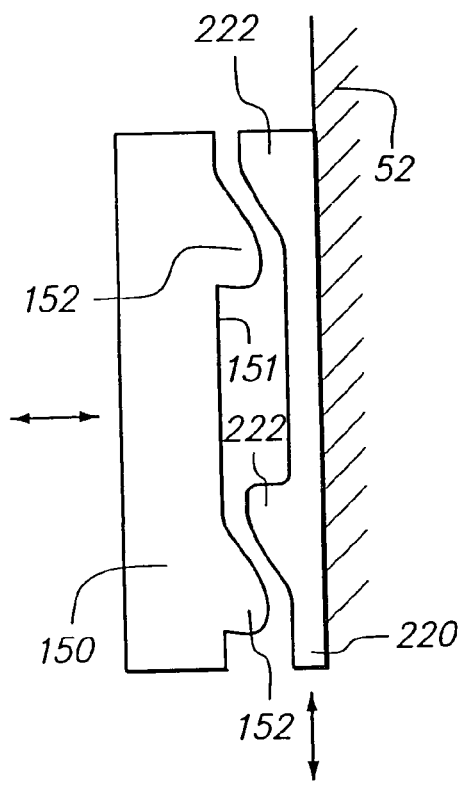
FIG. 17A illustrates a top down view of a first ramp translation mechanism.
Figure 17B:
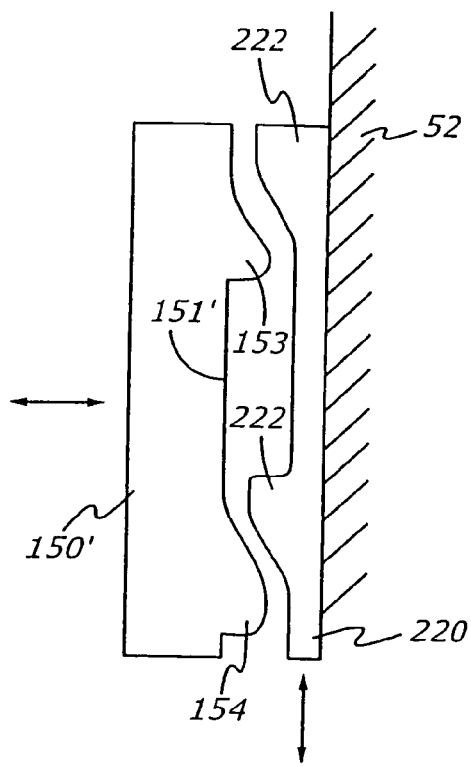
FIG. 17B illustrates a top down view of a third ramp translation mechanism.

Another translation mechanism uses ramp profiles. The back surface of the rejector plate is configured with ramp profiles. Alternatively, the ramp profiles are separate components that are attached to the rejector plate. These ramp profiles mate with translating ramps or rollers positioned against chassis guide. The use of rollers provides the advantage of lower friction and thus less force. The ramps or rollers can be individually contoured to provide "progressive" motion, which forces one side of the rejector plate to the chassis cold plate before the other side. This is similar to the cam configuration described above in which individual cams are configured with different shapes or orientations. FIG. 17A illustrates a top down view of a first ramp translation mechanism. A rejector plate 150 includes one or more ramp profiles 152 along a back surface 151. An actuating mechanism 220 is configured with one or more ramp profiles 222 that mate to the one or more ramp profiles 152. The actuating mechanism is positioned against a fixed surface within the chassis guide 52, such as the inside surface of the chassis guide 52. In some embodiments, the actuating mechanism 220 is fixed relative to the chassis guide 52 such that as the electronics server 34 is installed in the rack, the rejector plate 150 slides along the actuating mechanism 220 such that the ramp profiles 222 slide along the ramp profiles 152, thereby forcing the rejector plate 150 against the chassis cold plate 60. As shown in FIG. 17, the rejector plate 150 is translated from right to left according to this procedure. In other embodiments, the actuating mechanism 220 slides along the chassis guide 52. After the electronics server 34 is installed in the rack, a separate step is performed in which the actuating mechanism 220 is moved along the chassis guide, for example from top to bottom in FIG. 17, such that the ramp profiles 222 slide along the ramp profiles 152, thereby forcing the rejector plate 150 against the chassis cold plate 60. This step can be automatically performed as part of as locking procedure used to lock the electronics server 34 into the rack, or this step can be manually performed after the locking procedure. FIG. 17B illustrates a rejector plate 150' where the ramp profiles 153 and 154 are individually contoured to provide a non-uniform engagement profile.

Figure 18:
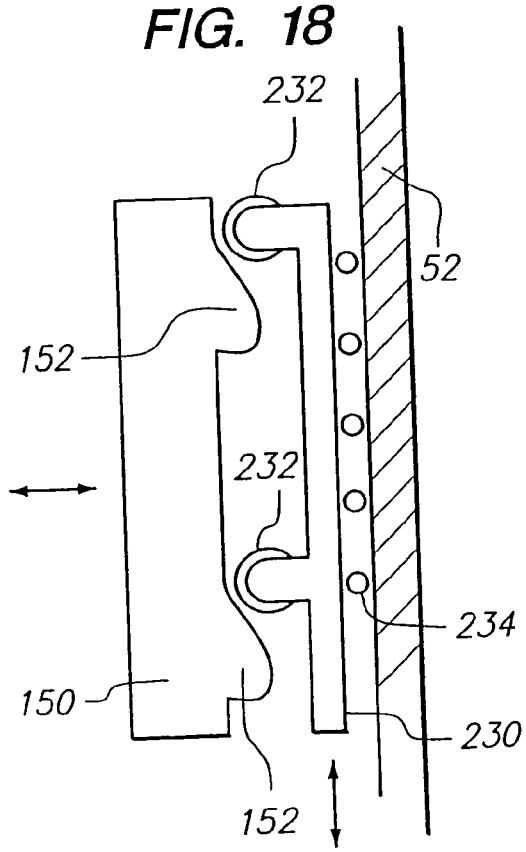
FIG. 18 illustrates a top down view of a second ramp translation mechanism.

FIG. 18 illustrates a top down view of a second ramp translation mechanism. The second ramp translation mechanism functions similarly to the first ramp translation mechanism with the exception that the ramp profiles 222 on the actuating mechanism are replaced by rollers. In particular, an actuating mechanism 230 is configured with one or more rollers 232 that mate to the one or more ramp profiles 152. The actuating mechanism is positioned against a fixed surface, such as the inside surface of the chassis guide 52. The rollers 232 reduce the friction against the ramp profiles 152. In some embodiments, the actuating mechanism 230 is fixed relative to the chassis guide 52. In other embodiments, the actuating mechanism 230 slides along the chassis guide 52. Alternative slides 234 can also be used to further reduce the friction generated when moving the actuating mechanism 230. It is understood that the location of the ramps and the rollers can be reversed while achieving the same effect. As with the cam configurations, use of the first and second ramp translation mechanisms requires a retracting means for disengaging the rejector plate 150 from the chassis cold plate 60. Spring means similar to that described above in relation to the cam configurations can be included in either the first or second ramp translation mechanisms.

Figure 19:
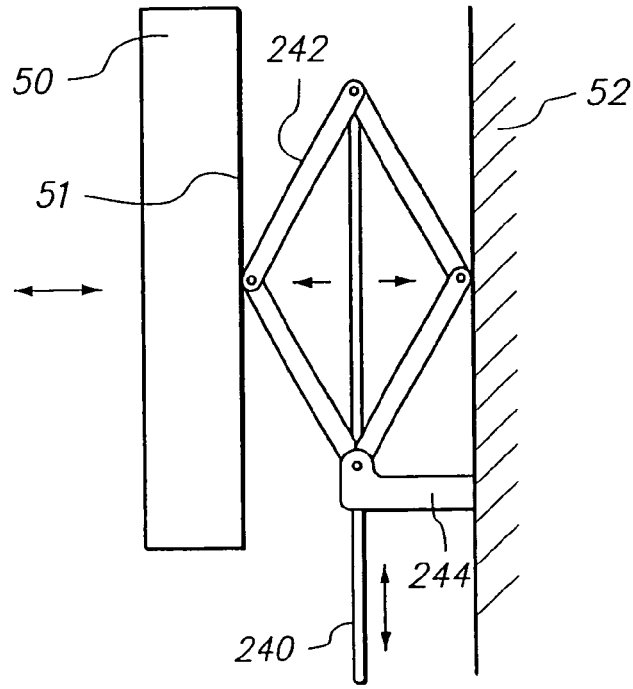
FIG. 19 illustrates a top down view of a scissor jack translation mechanism.

Another translation mechanism used is a scissor jack positioned between the rejector plate and a fixed surface within the chassis guide. FIG. 19 illustrates a top down view of a scissor jack translation mechanism. A scissor jack 242 is positioned between the back surface 51 of the rejector plate 50 and a fixed surface within the chassis guide 52, such as the inside surface of the chassis guide 52. An actuating rod 240 is coupled to open and close the scissor jack 242. For example, as applied to FIG. 19, upward movement of the actuating rod 240 opens the scissor jack 242, and downward movement of the actuating rod 240 closes the scissor jack 242. The scissor jack 242 can be held in place within the chassis guide 52 by an alternative support 244. In some embodiments, the actuating rod 240 is automatically actuated as part of locking procedure used to lock the electronics server 34 into the rack. In other embodiments, the actuating rod 240 is moved independently of the locking procedure. As with the cam configurations, use of the first and second ramp translation mechanisms requires a retracting means for disengaging the rejector plate 50 from the chassis cold plate 60. Spring means similar to that described above in relation to the cam configurations can be included in the scissor jack translation mechanism. Alternatively, the scissor jack can be configured to provide the retraction force.

Figure 20A:
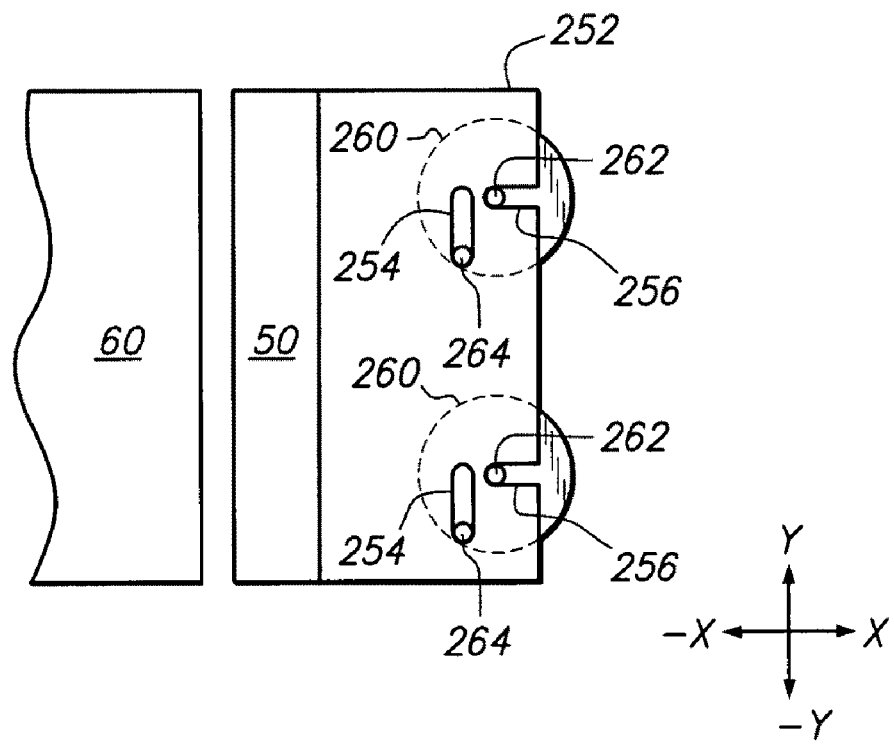
FIG. 20A illustrates a top down view of an exemplary embodiment of the translation mechanism using cams, slots, and pins in a disengaged position.
Figure 20B:
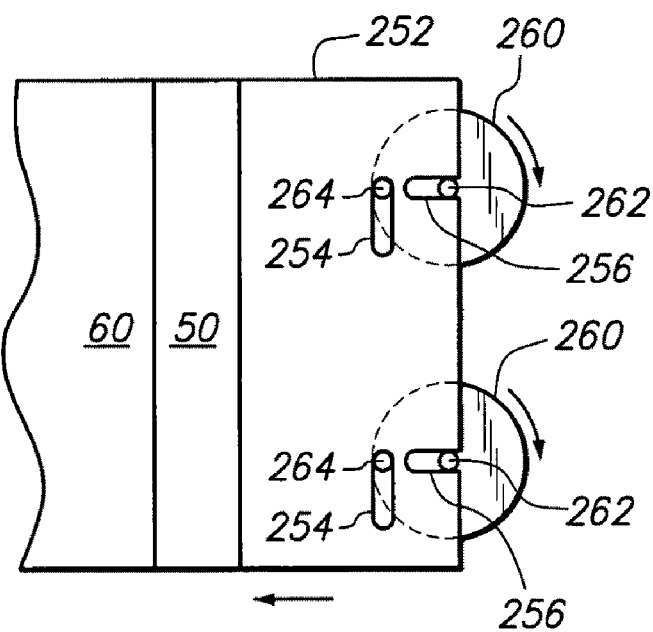
FIG. 20B illustrates a top down view of the translation mechanism of FIG. 20A in an engaged position.

Another translation mechanism uses cams in combination with slots and pins. Rotational movement of the cams is converted to linear movement of the rejector late. This translation mechanism is used to move the rejector plate to engage the chassis cold plate, and to move the rejector plate to disengage from the chassis cold plate. FIG. 20A illustrates a top down view of an exemplary embodiment of the translation mechanism using cams, slots, and pins in a disengaged position. In the disengaged position, the rejector plate 50 is disengaged from the chassis cold plate 60. A cold plate extension 252 is attached to the rejector plate 50. One or more cams 260 are coupled to the chassis guide 52 (FIG. 9) at a center position 262. The cams 260 are free to rotate about the center position 262, but are otherwise linearly fixed relative to the chassis guide 52. The center position 262 is positioned within a center slot 256 of the cold plate extension 252. Each cam 260 includes a pin 264 that extends perpendicularly from a surface of the cam. The pin 262 fits within a pin slot 254 of the cold plate extension 252. As the cam 260 rotates clockwise, the pin 264 is forced along the pin slot 254 in the Y-direction (upward relative to FIG. 20A), which generates a linear force in the X-direction. This linear force moves the cold plate extension 252, and therefore the rejector plate 50, in the X-direction to engage the chassis cold plate 60, as illustrated in FIG. 20B.

To disengage the rejector plate 50 from the chassis cold plate 60, the cams 260 are rotated counterclockwise. Counterclockwise rotation of the cams 260 forces the pin 262 along the pin slot 254 in the Y-direction (downward relative to FIG. 20B), which generated a linear force in the X-direction. This linear force moves the cold plate extension 252, and therefore the rejector plate 50, in the X-direction to disengage the chassis cold plate 60, as illustrated in FIG. 20A. Each of the cams 260 can be linked together via a mechanical linkage (not shown). In some embodiments, the mechanical linkage is automatically actuated as part of the locking procedure used to lock the electronics server 34 into the rack. In other embodiments, the mechanical linkage is moved independently of the locking procedure. It is understood that alternative configurations to the one shown in FIGS. 20A and 20B are also contemplated. For example, the profile of the pin slot 254 is shown in FIGS. 20A and 20B as a straight line in the Y direction, which results in substantially a linear conversion of rotational movement to linear movement. This profile can be adjusted, thereby altering the mechanical force profile applied to the rejector plate.

Figure 21A:
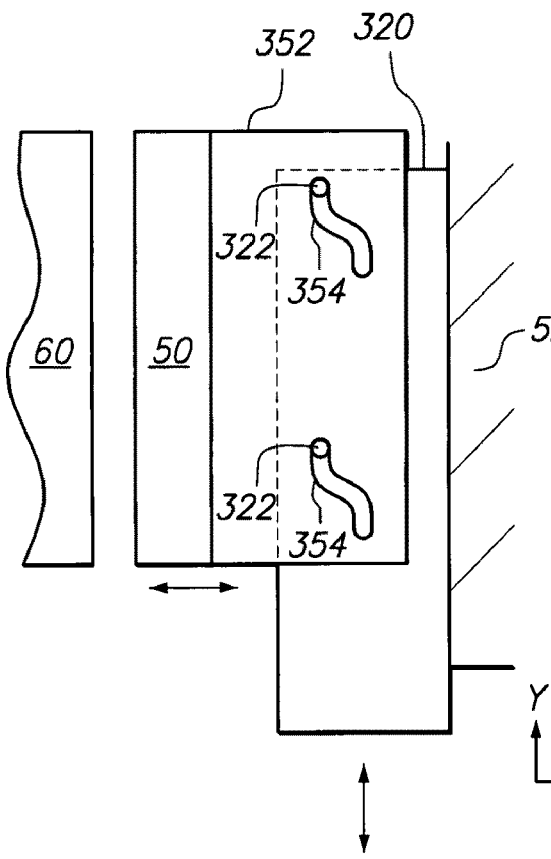
FIG. 21A illustrates a top down view of an exemplary embodiment of the translation mechanism using slots and pins in a disengaged position.
Figure 21B:
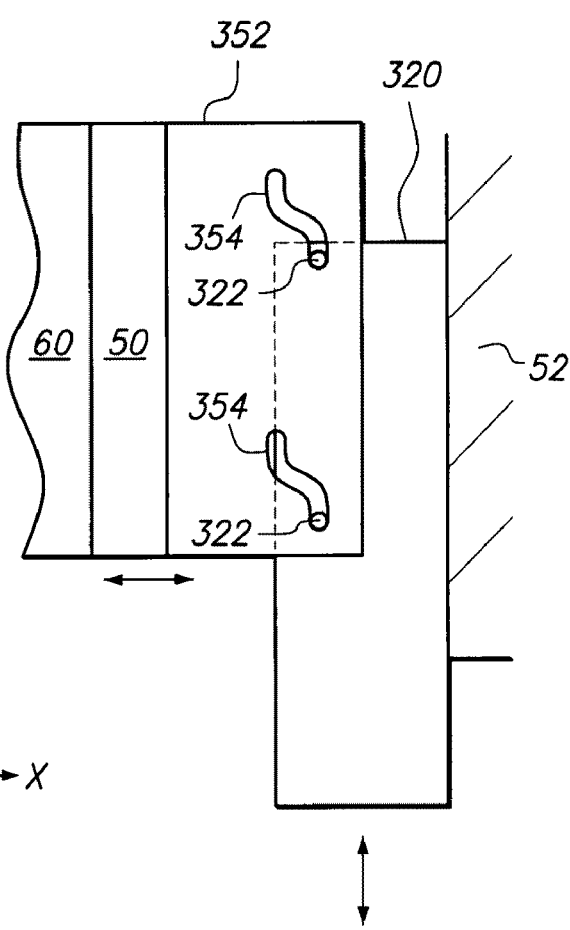
FIG. 21B illustrates a top down view of the translation mechanism of FIG. 21A in an engaged position.
Figure 21C:
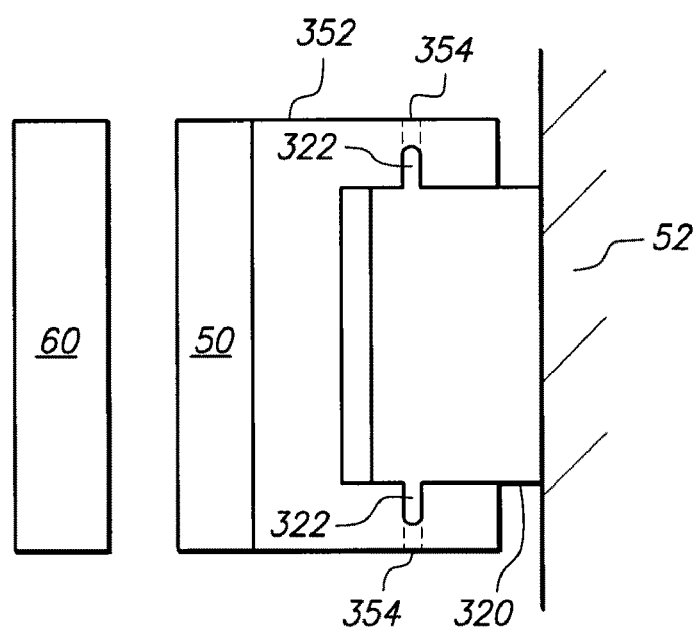
FIG. 21C illustrates a side view of the exemplary translation mechanism of FIG. 21A.

Another translation mechanism uses a combination of pins and slots with slot profiles. A linear motion in a first direction is translated to a linear motion in a second direction, preferably perpendicular to the first direction. This translation mechanism uses appropriately shaped slots to cause the rejector plate to engage the chassis cold plate. FIG. 21A illustrates a top down view of an exemplary embodiment of the translation mechanism using slots and pins in a disengaged position. FIG. 21C illustrates a side view of the exemplary translation mechanism of FIG. 21A. In the disengaged position, the rejector plate 50 is disengaged from the chassis cold plate 60. A cold plate extension 352 is attached to the rejector plate 50. The cold plate extension 352 includes one or more slots 354. An actuating rod 320 includes one or more pins 322 that extend perpendicularly from a surface of the actuating rod. Each pin 322 fits into one of the slots 354 of the cold plate extension 352. The actuating rod 320 slides back and forth in the Y-direction, but is fixed in the X-direction. As the actuating rod 320 moves in the Y-direction, the pins 322 move within the slots 354. Linear movement of the actuating rod 320 in the Y-direction is converted to linear movement of the cold plate extension 352, and therefore the attached rejector plate 50, depending on a slot profile of the slots 354. The slot profiles of each slot 354 can be the same, or different, depending on the required motion of the rejector plate 50. Varying the slot profile provides mechanical variations in the force applied to the rejector plate 50. According to the configuration in FIGS. 21A and 21B, as the actuating rod 320 is moved in the Y-direction, the rejector plate 50 is uniformly moved in the X-direction to engage the chassis cold plate 60, as shown in FIG. 21B. FIG. 21C illustrates a side view of the exemplary translation mechanism of FIG. 21A. In relation to FIG. 21C, the actuating rod 320 moves perpendicular to the page.

Figure 21D:
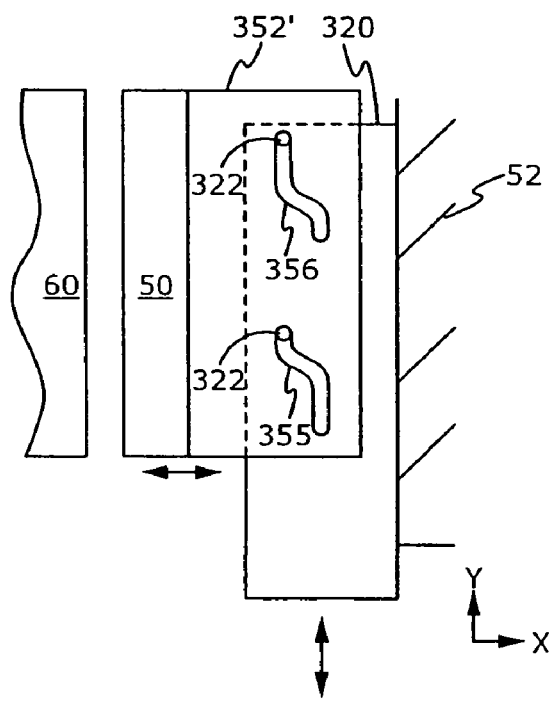
FIG. 21D illustrates a top down view of another exemplary embodiment of the translation mechanism using slots and pins in a disengaged position.
Figure 21E:
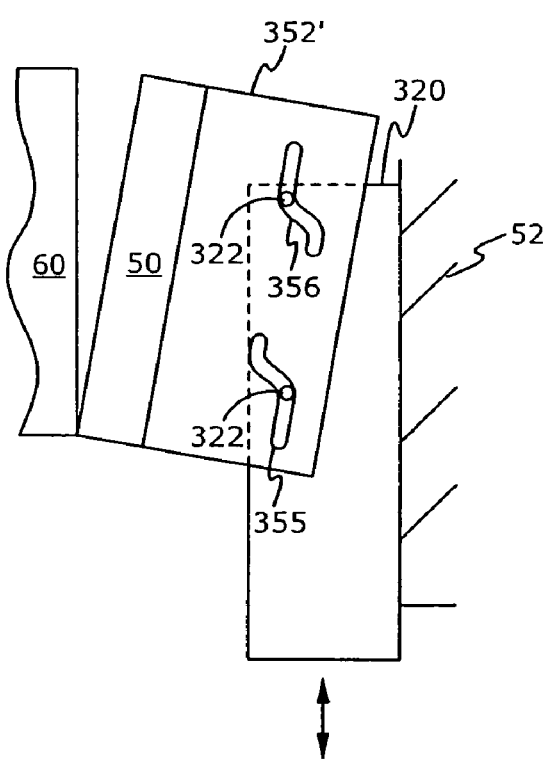
FIG. 21E illustrates a top down view of the translation mechanism of FIG. 21D in a partially engaged position.

To disengage the rejector plate 50 from the chassis cold plate 60, the actuating rod 320 is moved in the Y-direction. In some embodiments, the actuating rod 320 is automatically actuated as part of the locking procedure used to lock the electronics server 34 into the rack. In other embodiments, the actuating rod 320 is moved independently of the locking procedure. It is understood that alternative configurations to the one shown in FIGS. 21A and 21B are also contemplated. For example, FIG. 21D illustrates a translation mechanism in a disengaged position, where the translation mechanism includes a cold plate extension 352' with slots 355 and 356 that are individually contoured to provide a non-uniform engagement profile. As the actuating rod 320 is moved in the negative Y-direction, the rejector plate 50 is non-uniformly moved in the negative X-direction. FIG. 21E illustrates the translation mechanism of FIG. 21D in a partially engaged position, where a portion of the rejector plate 50 on the same side as the slot 355 is engaged to the chassis cold plate 60, while a remaining portion of the rejector plate 50 is not engaged. Further movement of the actuating rod 320 in the negative Y-direction moves the remaining portion of the rejector plate 50 into the engaged position, similarly to FIG. 21B.

Figure 22:
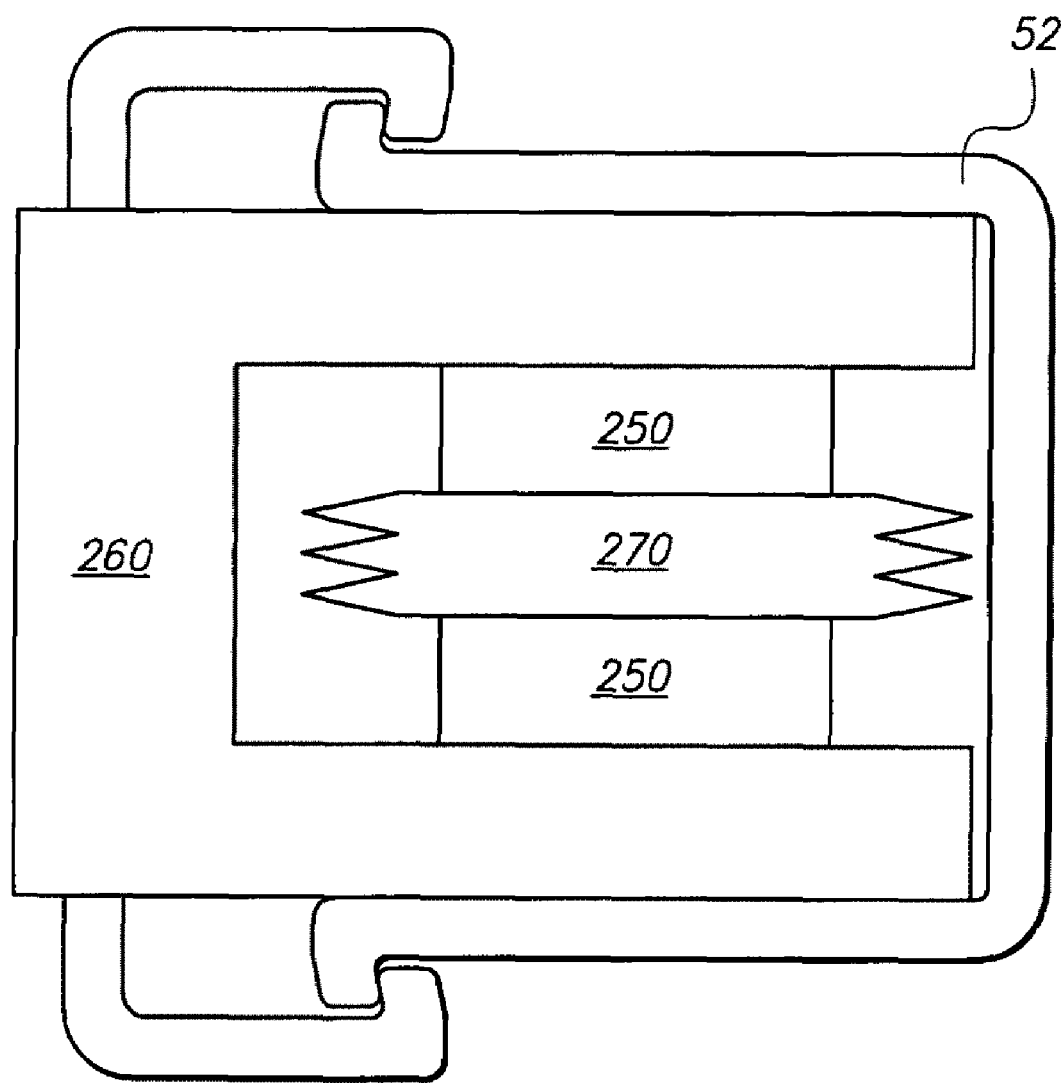
FIG. 22 illustrates an alternative configuration of the chassis cold plate and rejector plate.

FIG. 22 illustrates an alternative configuration of the chassis cold plate and rejector plate. The chassis cold plate 260 is configured as U-shaped, and each electronics server is configured with two rejector plates 250. The rejector plates 250 are aligned inside the U-shaped chassis cold plate 260, as shown in FIG. 22. An expansion mechanism 270 is positioned between the rejector plates 250. Examples of the expansion mechanism include, but are not limited to, a bellows or a bladder. The expansion mechanism 270 can also be any one of the previously described actuation means, or a variation thereof. As the expansion mechanism 270 expands against the rejector plates 250, the rejector plates are engaged to the chassis cold plate 260. The configuration described above can include the force containment assembly 52 (as shown in FIG. 22) or not include the force containment assembly 52.

The actuating force used to actuate the various translation mechanism described herein above can be provided using various actuating means. Examples of such actuating means include, but are not limited to, mechanical linkages, such as pull/push rods, screw drives, hydraulics, electromechanical motors or actuators, and pneumatics.

It is understood that the specific embodiments of the mounting assembly and the actuating mechanisms described above are for exemplary purposes only. In general, the rejector plate of the electronics server can be movable or fixed relative to the electronics server circuit board, and/or the chassis cold plate of the rack can be movable or fixed relative to the rack chassis, and any of the mounting assemblies and actuating mechanisms described herein can be applied to various combinations of movable and/or fixed rejector plate and chassis cold plate configurations.

It is also understood that the thermal interface is configurable on all surface of the electronics server, except for the rack connection side, depending on the application.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A mounting system to couple two heat exchangers, the mounting mechanism comprising:
   a. a server rack including a first heat exchanger;
   b. one or more electronics servers each coupled to the server rack via an electrical interface, each electronics server includes a second heat exchanger;
   c. a translation mechanism coupled to the first heat exchanger and the second heat exchanger, wherein the translation mechanism is configured to apply an engagement force to the first heat exchanger and the second heat exchanger, thereby forming a thermal interface between the first heat exchanger and the second heat exchanger; and
   d. a force containment assembly coupled to the translation mechanism, the force containment assembly includes a chassis guide coupled to the electronics server and a rack channel coupled to the rack server, wherein the chassis guide is coupled to the rack channel to form an interlocking channel, further wherein the force containment assembly isolates the engagement force from the electrical interface.

2. The mounting system of claim 1 wherein the translation mechanism is configured to provide a uniform engagement profile between the first heat exchanger and the second heat exchanger such that an entire engagement surface of the second heat exchanger is simultaneously forced against an engagement surface of the first heat exchanger.

3. The mounting system of claim 1 wherein the translation mechanism is configured to provide a non-uniform engagement profile between the first heat exchanger and the second heat exchanger such that a first portion of an engagement surface of the second heat exchanger is forced against an engagement surface of the first heat exchanger prior to a second portion of the engagement surface of the second heat exchanger.

4. The mounting system of claim 1 further comprising an actuating mechanism coupled to the translation mechanism, wherein the actuating mechanism is configured to actuate the translation mechanism to apply the engagement force.

5. The mounting system of claim 4 wherein the translation mechanism and the actuating mechanism are configured such that an actuating force applied to the actuating mechanism is translated to the engagement force.

6. The mounting system of claim 5 wherein the actuating force is directed along a first vector and the engagement force is directed along a second vector different than the first vector.

7. The mounting system of claim 4 wherein the actuating mechanism is an actuating rod.

8. The mounting system of claim 4 wherein the actuating mechanism is a screw.

9. The mounting system of claim 4 wherein the actuating mechanism comprises one or more of an electro-mechanical actuator, a pneumatic actuator, and a hydraulic actuator.

10. The mounting system of claim 1 wherein the force containment assembly is configured to provide a float area between the chassis guide and a chassis of the electronics server.

11. The mounting system of claim 1 wherein the force containment assembly is configured to include a float area.

12. The mounting system of claim 1 wherein a first portion of the server rack includes the first heat exchanger and a first portion of the electronics server includes the second heat exchanger, further wherein the force containment assembly isolates the engagement force from a remaining portion of the electronics server and from a remaining portion of the server rack.

13. The mounting system of claim 1 wherein the translation mechanism comprises a spring coupled to the first heat exchanger and one or more cams coupled to the second heat exchanger.

14. The mounting system of claim 1 wherein the server rack includes one or more first heat exchangers.

15. The mounting system of claim 1 wherein each electronics server includes one or more second heat exchangers.

16. The mounting system of claim 1 wherein the force containment assembly isolates the engagement force from the server rack.

17. The mounting system of claim 1 wherein the force containment assembly isolates the engagement force from the electronics server.

18. The mounting system of claim 1 wherein each electronics server comprises a blade server.

19. The mounting system of claim 1 wherein each electronics server comprises a rack server.

20. The mounting system of claim 1 wherein the first heat exchanger is configured to be fixed in position, and the second heat exchanger is configured to be movable relative to the electronics server.

21. The mounting system of claim 1 wherein the first heat exchanger is configured to be movable relative to the server rack, and the second heat exchanger is configured to be movable relative to the electronics server.

22. A mounting system to form a thermal interface between two heat exchangers, the mounting mechanism comprising:
   a. a server rack including a first heat exchanger;
   b. one or more electronics servers coupled to the server rack, each electronics server includes a second heat exchanger;
   c. a translation mechanism coupled to the first heat exchanger and the second heat exchanger, wherein the translation mechanism is configured to apply an engagement force to the first heat exchanger and the second heat exchanger, thereby forming a thermal interface between the first heat exchanger and the second heat exchanger; and
   d. a force containment assembly configured to house the translation mechanism, the force containment assembly including a chassis guide coupled to the electronics server and a rack channel coupled to the server rack, wherein the chassis guide is coupled to the rack channel to form an interlocking channel, further wherein the force containment assembly contains the engagement force.

23. The mounting system of claim 22 wherein the translation mechanism is configured to provide a uniform engagement profile between the first heat exchanger and the second heat exchanger such that an entire engagement surface of the first heat exchanger is simultaneously forced against an engagement surface of the second heat exchanger.

24. The mounting system of claim 22 wherein the translation mechanism is configured to provide a non-uniform engagement profile between the first heat exchanger and the second heat exchanger such that a first portion of an engagement surface of the first heat exchanger is forced against an engagement surface of the second heat exchanger prior to a second portion of the engagement surface of the first heat exchanger.

25. The mounting system of claim 22 further comprising an actuating mechanism coupled to the translation mechanism, wherein the actuating mechanism is configured to actuate the translation mechanism to apply the engagement force.

26. The mounting system of claim 25 wherein the translation mechanism and the actuating mechanism are configured such that an actuating force applied to the actuating mechanism is translated to the engagement force.

27. The mounting system of claim 26 wherein the actuating force is directed along a first vector and the engagement force is directed along a second vector different than the first vector.

28. The mounting system of claim 25 wherein the translation mechanism is further configured to apply a disengagement force.

29. The mounting system of claim 28 wherein the translation mechanism is configured to provide a uniform disengagement profile between the first heat exchanger and the second heat exchanger such that an entire engagement surface of the first heat exchanger is simultaneously separated from an engagement surface of the second heat exchanger.

30. The mounting system of claim 28 wherein the translation mechanism is configured to provide a non-uniform disengagement profile between the first heat exchanger and the second heat exchanger such that a first portion of an engagement surface of the first heat exchanger is separated from an engagement surface of the second heat exchanger prior to a second portion of the engagement surface of the first heat exchanger.

31. The mounting system of claim 28 wherein the actuating mechanism is further configured to actuate the translation mechanism to apply the disengagement force.

32. The mounting system of claim 25 wherein the actuating mechanism is an actuating rod.

33. The mounting system of claim 25 wherein the actuating mechanism is a screw.

34. The mounting system of claim 25 wherein the actuating mechanism comprises one or more of an electro-mechanical actuator, a pneumatic actuator, and a hydraulic actuator.

35. The mounting system of claim 22 wherein the force containment assembly is configured to provide a float area between the chassis guide and a chassis of the electronics server.

36. The mounting system of claim 22 wherein the force containment assembly is configured to include a float area.

37. The mounting system of claim 22 wherein a first portion of the server rack includes the first heat exchanger and a first portion of the electronics server includes the second heat exchanger, further wherein the force containment assembly isolates the engagement force from a remaining portion of the electronics server and from a remaining portion of the server rack.

38. The mounting system of claim 22 wherein the translation mechanism comprises a spring coupled to the second heat exchanger, further wherein the first heat exchanger is coupled to a fixed surface within the force containment assembly.

39. The mounting system of claim 22 wherein the translation mechanism comprises a spring coupled to the first heat exchanger and one or more cams coupled to the second heat exchanger.

40. The mounting system of claim 22 wherein the translation mechanism comprises a first spring coupled to the first heat exchanger and an extension plate coupled to the second heat exchanger, wherein the extension plate includes one or more ramp profiles configured to define a translation motion of the second heat exchanger.

41. The mounting system of claim 40 wherein each ramp profile is the same.

42. The mounting system of claim 40 wherein one or more of the ramp profiles are different.

43. The mounting system of claim 40 further comprising an actuating mechanism coupled to the translation mechanism, wherein the actuating mechanism includes one or more ramp profiles configured to slide against the one or more ramp profiles of the extension plate, thereby translating the second heat exchanger according to the defined translation motion.

44. The mounting system of claim 40 further comprising an actuating mechanism coupled to the translation mechanism, wherein the actuating mechanism includes one or more rollers configured to roll along the one or more ramp profiles of the extension plate, thereby translating the second heat exchanger according to the defined translation motion.

45. The mounting system of claim 22 wherein the translation mechanism comprises a spring coupled to the first heat exchanger and an extension plate coupled to the second heat exchanger, wherein the extension plate includes one or more slot profiles configured to define a translation motion of the of the second heat exchanger.

46. The mounting system of claim 45 wherein each slot profile is the same.

47. The mounting system of claim 45 wherein one or more of the slot profiles are different.

48. The mounting system of claim 45 further comprising an actuating mechanism coupled to the translation mechanism, wherein the actuating mechanism includes one or more pins, one at least one pin positioned within a slot profile of the extension plate, wherein each pin is configured to slide within the ramp profile, thereby translating the second heat exchanger according to the defined translation motion.

49. The mounting system of claim 45 wherein the translation mechanism further comprises one or more cams coupled to the cold plate extension, wherein each cam includes one or more pins, at least one pin positioned within a slot profile of the extension plate, wherein each pin is configured to slide within the ramp profile, thereby translating the second heat exchanger according to the defined translation motion.

50. The mounting system of claim 49 further comprising an actuating mechanism coupled to the one or more cams, wherein the actuating mechanism is configured to actuate the one or more cams to apply the engagement force.

51. The mounting system of claim 22 wherein the translation mechanism comprises a spring coupled to the first heat exchanger and a scissor jack coupled to the second heat exchanger.

52. The mounting system of claim 22 wherein the translation mechanism comprises an expandable device coupled to the second heat exchanger.

53. The mounting system of claim 22 wherein the translation mechanism comprises an expandable device coupled to the first heat exchanger.

54. The mounting system of claim 22 wherein the server rack includes one or more first heat exchangers.

55. The mounting system of claim 22 wherein each electronics server includes one or more second heat exchangers 56. The mounting system of claim 22 wherein the force containment assembly isolates the engagement force from the server rack.

57. The mounting system of claim 22 wherein the force containment assembly isolates the engagement force from the electronics server.

58. The mounting mechanism of claim 22 wherein each electronics server is coupled to the server rack via an electrical interface, and the force containment assembly isolates the engagement force from the electrical interface.

59. The mounting system of claim 22 wherein each electronics server comprises a blade server.

60. The mounting system of claim 22 wherein each electronics server comprises a rack server.

61. The mounting system of claim 22 wherein the first heat exchanger is configured to be fixed in position, and the second heat exchanger is configured to be movable relative to the electronics server.

62. The mounting system of claim 22 wherein the first heat exchanger is configured to be movable relative to the server rack, and the second heat exchanger is configured to be movable relative to the electronics server.

63. A mounting system to couple two heat exchangers, the mounting mechanism comprising:
   a. a server rack including a first heat exchanger;
   b. one or more electronics servers each coupled to the server rack via an electrical interface, each electronics server includes a second heat exchanger;
   c. a translation mechanism coupled to the first heat exchanger and the second heat exchanger, wherein the translation mechanism is configured to apply an engagement force to the first heat exchanger and the second heat exchanger, thereby forming a thermal interface between the first heat exchanger and the second heat exchanger;
   d. a force containment assembly coupled to the translation mechanism, wherein the force containment assembly isolates the engagement force from the electrical interface; and an actuating mechanism coupled to the translation mechanism, wherein the actuating mechanism is configured to actuate the translation mechanism to apply the engagement force, further wherein the actuating mechanism comprises a screw.

64. A mounting system to couple two heat exchangers, the mounting mechanism comprising:
   a. a server rack including a first heat exchanger;
   b. one or more electronics servers each coupled to the server rack via an electrical interface, each electronics server includes a second heat exchanger;
   c. a translation mechanism coupled to the first heat exchanger and the second heat exchanger, wherein the translation mechanism is configured to apply an engagement force to the first heat exchanger and the second heat exchanger, thereby Forming a thermal interface between the first heat exchanger and the second heat exchanger;
   d. a force containment assembly coupled to the translation mechanism, wherein the force containment assembly isolates the engagement force from the electrical interface; and
   e. an actuating mechanism coupled to the translation mechanism, wherein the actuating mechanism is configured to actuate the translation mechanism to apply the engagement force, further wherein the actuating mechanism comprises one or more of an electromechanical actuator, a pneumatic actuator, or a hydraulic actuator.

65. A mounting system to couple two heat exchangers, the mounting mechanism comprising:
   a. a server rack including a first heat exchanger;
   b. one or more electronics servers each coupled to the server rack via an electrical interface, each electronics server includes a second heat exchanger;
      a translation mechanism comprising a spring coupled to the first heat exchanger and one or more cams coupled to the second heat exchanger, wherein the translation mechanism is configured to apply an engagement force to the first heat exchanger and the second heat exchanger, thereby forming a thermal interface between the first heat exchanger and the second heat exchanger; and
   d. a force containment assembly coupled to the translation mechanism, wherein the force containment assembly isolates the engagement force from the electrical interface.

* * * * *

UNITED STATES PATENT AND TRADEMARK OFFICE
CERTIFICATE OF CORRECTION

| | | |
|---|---|---|
| PATENT NO. | : 7,539,020 B2 | Page 1 of 1 |
| APPLICATION NO. | : 11/707332 | |
| DATED | : May 26, 2009 | |
| INVENTOR(S) | : Norman Chow et al. | |

It is certified that error appears in the above-identified patent and that said Letters Patent is hereby corrected as shown below:

<u>TITLE PAGE, UNDER ITEM [56] IN THE REFERENCES CITED</u>

Under U.S. PATENT DOCUMENTS, please add reference U.S. Patent No. 4,726,495 to Aihara et al., issued on March 10, 1998.

Signed and Sealed this

Fourteenth Day of July, 2009

JOHN DOLL
*Acting Director of the United States Patent and Trademark Office*